(12) United States Patent
Kim

(10) Patent No.: US 8,304,886 B2
(45) Date of Patent: Nov. 6, 2012

(54) SEMICONDUCTOR DEVICE HAVING INTEGRAL STRUCTURE OF CONTACT PAD AND CONDUCTIVE LINE

(75) Inventor: Dong-hyun Kim, Hwaseong-si (KR)

(73) Assignee: Samsung Electronics Co., Ltd (KR)

( * ) Notice: Subject to any disclaimer, the term of this patent is extended or adjusted under 35 U.S.C. 154(b) by 81 days.

(21) Appl. No.: 12/590,802

(22) Filed: Nov. 13, 2009

(65) Prior Publication Data

US 2010/0244269 A1    Sep. 30, 2010

(30) Foreign Application Priority Data

Mar. 31, 2009   (KR) .......................... 10-2009-0027756

(51) Int. Cl.
*H01L 23/48* (2006.01)
(52) U.S. Cl. . 257/692; 257/677; 257/695; 257/E21.511; 257/E23.001; 257/E27.081
(58) Field of Classification Search .................. 257/773, 257/E23.019, 692, 677, 695, E21.511, E21.679, 257/E23.001, E27.081
See application file for complete search history.

(56) References Cited

U.S. PATENT DOCUMENTS

| | | | | |
|---|---|---|---|---|
| 5,315,472 A | * | 5/1994 | Fong et al. ..................... | 361/212 |
| 5,471,163 A | * | 11/1995 | Childers ........................ | 327/525 |
| 5,568,171 A | * | 10/1996 | Keefe et al. ..................... | 347/58 |
| 5,635,968 A | * | 6/1997 | Bhaskar et al. ................. | 347/59 |
| 5,995,189 A | * | 11/1999 | Zhang ............................ | 349/153 |
| 6,271,113 B1 | | 8/2001 | Yoon et al. | |
| 6,888,585 B2 | * | 5/2005 | Kim ............................... | 349/43 |
| 6,930,324 B2 | * | 8/2005 | Kowalski et al. ............... | 257/48 |
| 7,081,939 B2 | * | 7/2006 | Kim ............................... | 349/152 |
| 7,419,246 B2 | * | 9/2008 | Malpica ........................ | 347/50 |
| 7,583,328 B2 | * | 9/2009 | Kim ............................... | 349/43 |
| 7,662,721 B2 | * | 2/2010 | Manger et al. ................ | 438/717 |
| 7,885,114 B2 | * | 2/2011 | Park et al. ................. | 365/185.17 |
| 2001/0026345 A1 | * | 10/2001 | Park et al. ...................... | 349/149 |
| 2006/0077702 A1 | * | 4/2006 | Sugimae et al. ................ | 365/63 |
| 2007/0158688 A1 | * | 7/2007 | Caspary et al. ................ | 257/208 |
| 2007/0164948 A1 | * | 7/2007 | Kim et al. ........................ | 345/87 |
| 2008/0081461 A1 | * | 4/2008 | Lee et al. ....................... | 438/637 |
| 2009/0154240 A1 | * | 6/2009 | Park et al. ................. | 365/185.05 |
| 2010/0155959 A1 | * | 6/2010 | Park et al. ...................... | 257/773 |

FOREIGN PATENT DOCUMENTS

| | | |
|---|---|---|
| JP | 2008-108788 A | 5/2008 |
| KR | 10-0298458 B1 | 5/2001 |
| KR | 10-0790998 B1 | 12/2007 |

\* cited by examiner

*Primary Examiner* — Zandra Smith
*Assistant Examiner* — Tsz Chiu
(74) *Attorney, Agent, or Firm* — Onello & Mello LLP

(57) ABSTRACT

Provided are a semiconductor device and a method of forming a semiconductor device in which a plurality of patterns are simultaneously formed to have different widths and the pattern densities of some regions are increased using a double patterning. The semiconductor device includes a plurality of conductive lines each including a first line portion and a second line portion, where the first line portion extends on a substrate in a first direction, the second line portion extends from one end of the first line portion in a second direction different from the first direction; a plurality of contact pads each of which is connected with a respective conductive line of the plurality of conductive lines and a respective second line portion of a respective conductive line of the plurality of conductive lines; and a plurality of dummy conductive lines each including a first dummy portion extending from a respective contact pad of the plurality of contact pads, in parallel with the corresponding second line portion in the second direction.

2 Claims, 29 Drawing Sheets

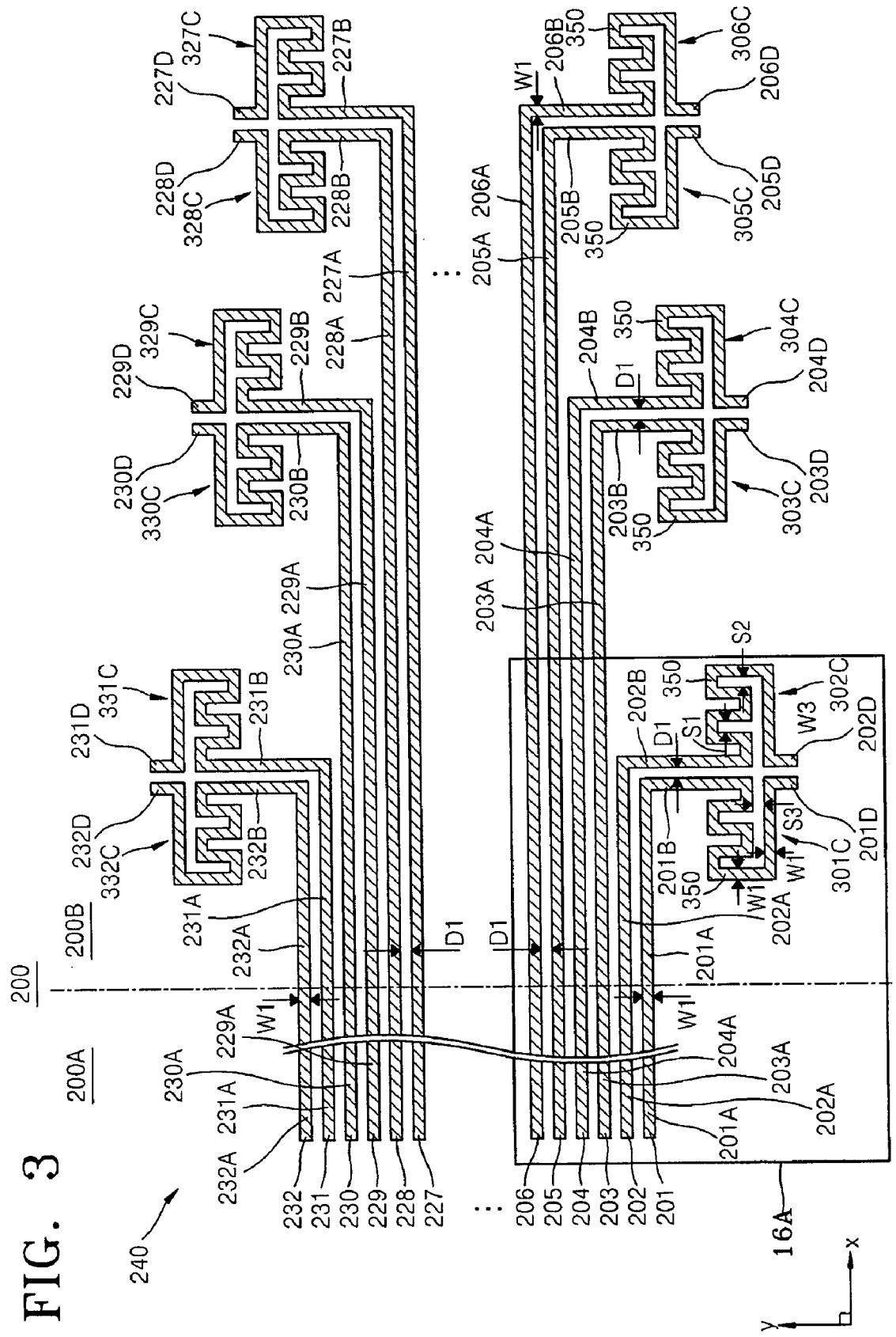

FIG. 6B
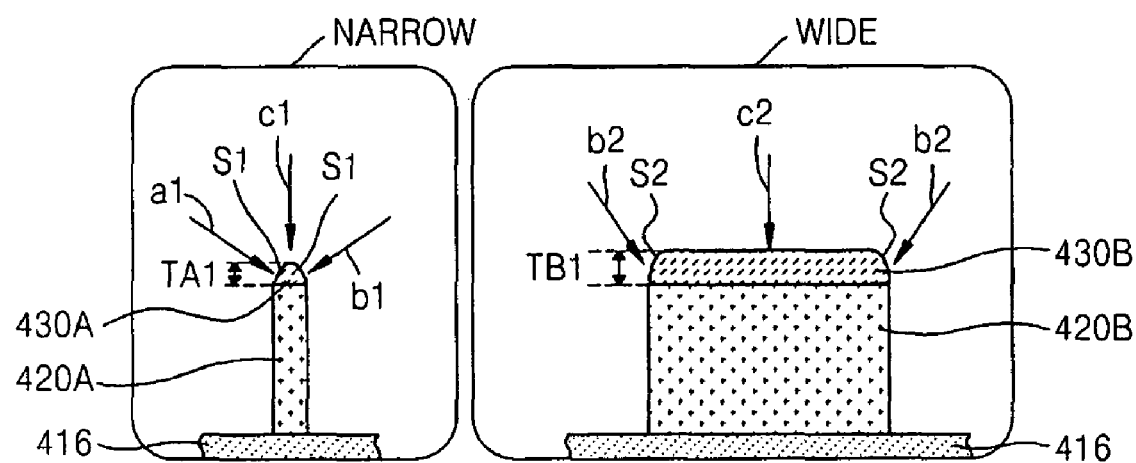
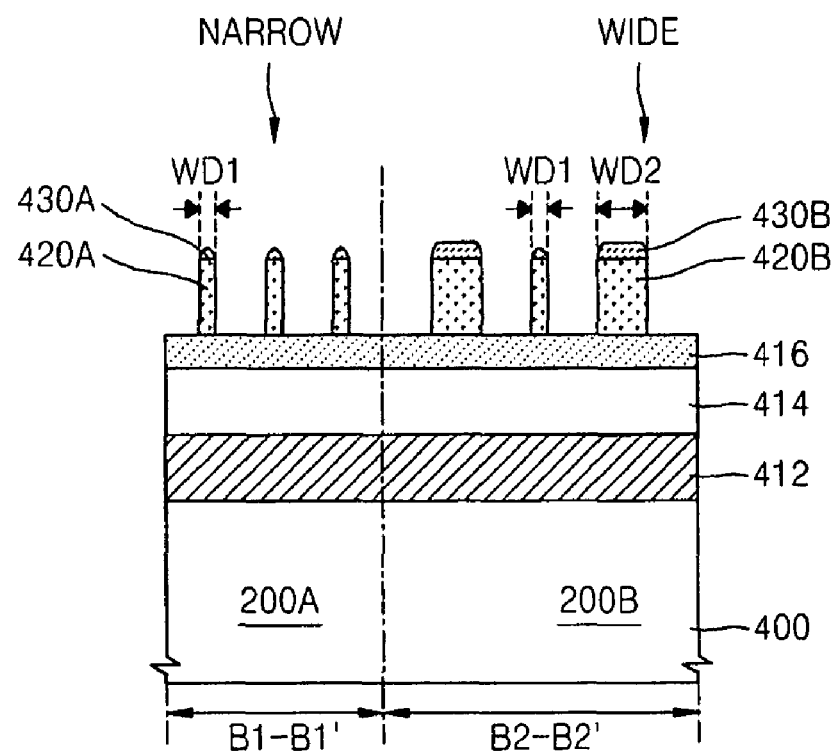

FIG. 8B
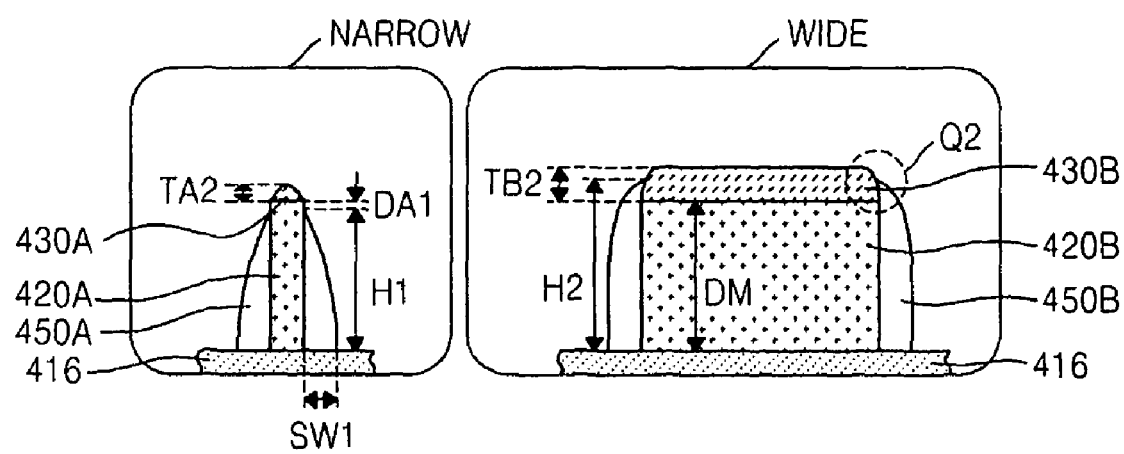
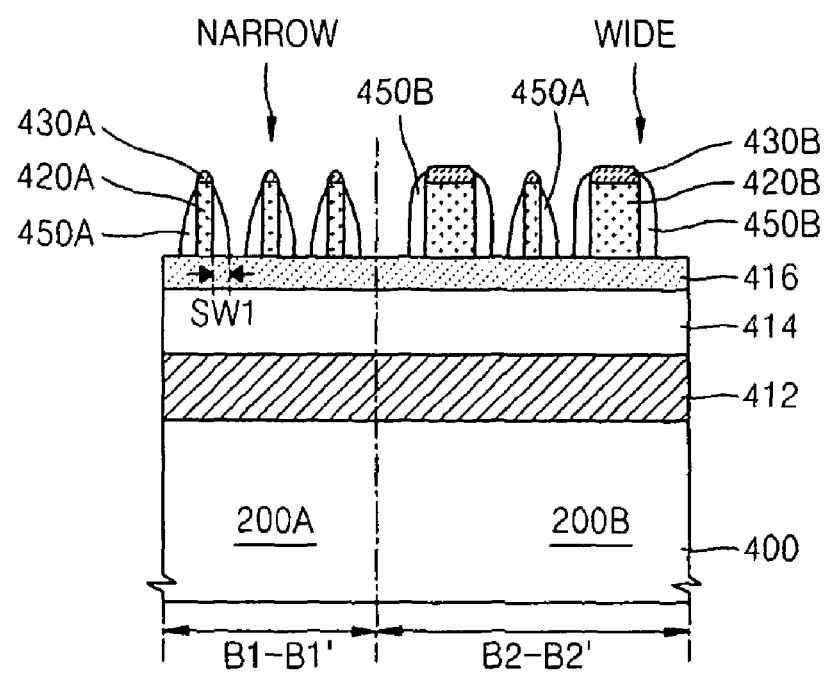

__US 8,304,886 B2__

SEMICONDUCTOR DEVICE HAVING INTEGRAL STRUCTURE OF CONTACT PAD AND CONDUCTIVE LINE

CROSS-REFERENCE TO RELATED APPLICATIONS

This application claims the benefit of Korean Patent Application No. 10-2009-0027756, filed on Mar. 31, 2009, in the Korean Intellectual Property Office, the entire contents of which are incorporated herein in their entirety by reference.

BACKGROUND

The inventive concept relates to a semiconductor device, and more particularly, to a semiconductor device having a narrow conductive line selected from among high-density patterns and a wide contact pad that is a low-density pattern connected to the narrow conductive line.

In order to manufacture high-scale integrated semiconductor devices, there is a need for development of a technique of simultaneously forming patterns with various widths, including minute patterns having a pitch less than the resolution limit of a photolithography process and patterns having a relatively large pitch which can be obtained using the photolithography process, while minimizing the number of operations in the photolithography process. Also, there is a need for development of a semiconductor device having a layout pattern suitable for this technique to be applied thereto.

SUMMARY

The inventive concept provides a semiconductor device that is manufactured by simultaneously forming a plurality of patterns, which have various pitches and are connected to one another, without having to increase the number of operations in a photolithography process used to manufacture the semiconductor device.

According to an aspect of the inventive concept, there is provided a semiconductor device including a plurality of conductive lines each comprising a first line portion extending on a substrate in a first direction and a second line portion extending from one end of the first line portion in a second direction different from the first direction. A plurality of contact pads are respectively connected to the second line portions of the plurality of conductive lines. A plurality of dummy conductive lines are respectively connected to the plurality of conductive lines via the plurality of contact pads and extend from the plurality of contact pads to be opposite to the second line portions in parallel with the second line portions.

The widths of the plurality of contact pads in the first direction may be respectively greater than the widths of the second line portions being respectively connected to the plurality of contact pads in the first direction.

Each of the plurality of contact pads may include a rectangular pattern. The widths of the rectangular pattern in the first and second directions may be greater than the widths of the second line portions in the first direction.

Each of the plurality of contact pads may include a concavo-convex line pattern extending from its corresponding second line portion to its corresponding dummy conductive line. The concavo-convex line pattern may extend having the same width as its corresponding second line portion in a direction of the length of the concavo-convex line pattern.

The plurality of conductive lines each may include a first conductive line and a second conductive line which are adjacent to each other. The plurality of contact pads each may include a first contact pad connected to the second line portion of the first conductive line and a second contact pad connected to the second line portion of the second conductive line. The first and second contact pads may be symmetrical with each other about a line extending in the second direction. The plurality of dummy conductive lines each may include a first dummy conductive line connected to the first contact pad and a second dummy conductive line connected to the second contact pad. The first and second dummy conductive lines may extend to be parallel with each other in the second direction. The distance between the second line portions of the first and second conductive lines may be equal to the distance between the first and second dummy conductive lines.

Each of the first and second contact pads may include a rectangular pattern. The widths of the rectangular pattern in the first and second directions may be greater than the widths of the second line portions in the first direction.

The first contact pad may include a first concavo-convex line pattern extending from the second line portion of the first conductive line to the first dummy conductive line. The second contact pad may include a second concavo-convex line pattern extending from the second line portion of the second conductive line to the second dummy conductive line. The first concavo-convex line pattern may extend having the same width as the second line portion of the first conductive line in a direction of the length of the first concavo-convex line pattern. The second concavo-convex line pattern may extend having the same width as the second line portion of the second conductive line in a direction of the length of the second concavo-convex line pattern. The space defined by the first and second concavo-convex line patterns may be less than or equal to the distance between the first and second dummy conductive line patterns.

BRIEF DESCRIPTION OF THE DRAWINGS

The foregoing and other features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIG. 3 is a layout diagram of a part of a semiconductor device according to another embodiment of the inventive concept.

DETAILED DESCRIPTION OF THE EMBODIMENTS

Figure 1:
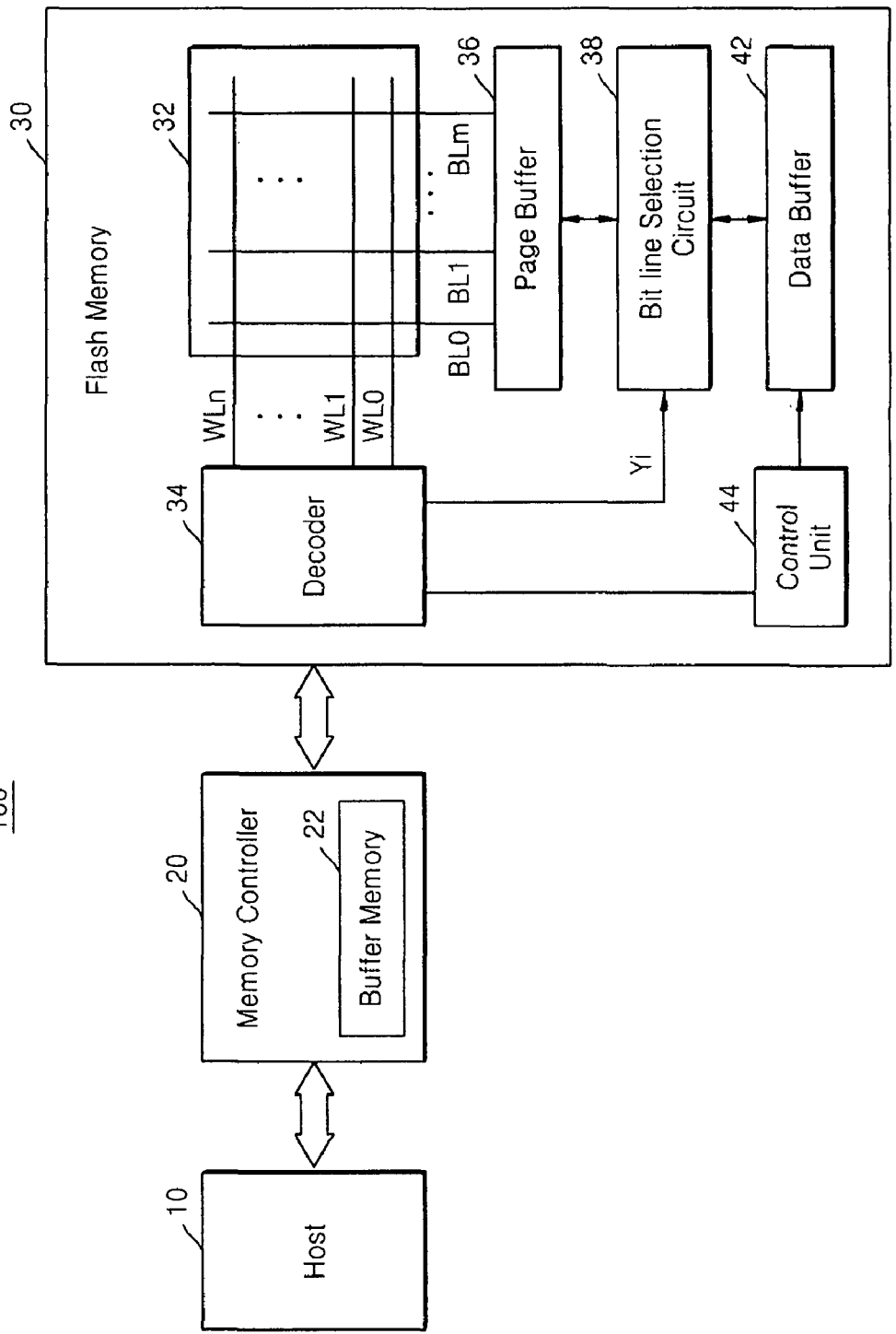
FIG. 1 is a schematic block diagram of an example of a memory system for a semiconductor device, according to an embodiment of the inventive concept.

Hereinafter, exemplary embodiments of the inventive concept will be described in greater detail with reference to the accompanying drawings. The inventive concept may, however, be embodied in many different forms and should not be construed as being limited to the embodiments set forth herein. Rather, these embodiments are provided so that this description will be thorough and complete and will fully convey the inventive concept to those of ordinary skill in the art. In the drawings, the thickness and width of layers and regions may be exaggerated for clarity. The same reference numerals represent the same elements throughout the drawings. For convenience of description, various elements and regions are schematically illustrated, and thus, the inventive concept is not limited thereto.

FIG. 1 is a schematic block diagram of an example of a memory system 100 for a semiconductor device, according to an embodiment of the inventive concept. Referring to FIG. 1, the memory system 100 for a semiconductor device includes a host 10, a memory controller 20, and a flash memory 30.

The memory controller 20 functions as an interface between the host 10 and the flash memory 30, and includes a buffer memory 22. The memory controller 20 may further include a central processing unit (CPU), a read only memory (ROM), a random access memory (RAM), and interface blocks.

The flash memory 30 may include a cell array 32, a decoder 34, a page buffer 36, a bit line selection circuit 38, a data buffer 42, and a control unit 44.

Data and a write command are input from the host 10 to the memory controller 20, and the memory controller 20 controls the flash memory 30 so that the data may be written to the cell array 32, in response to the write command. Also, the memory controller 20 controls the flash memory 30 so that data may be read from the cell array 32, in response to a read command from the host 10. The buffer memory 22 temporarily stores data exchanged between the host 10 and the flash memory 30.

The cell array 32 of the flash memory 30 includes a plurality of memory cells. The decoder 34 is connected to the cell array 32 via word lines WL0, WL1, . . . , through WLn. The decoder 34 receives an address from the memory controller 20, and either selects one word line from among the word lines WL0, WL1, . . . , through WLn or generates a selection signal Yi for selecting one bit line from among bit lines BL0, BL1, . . . , through BLm. The page buffer 36 is connected to the cell array 32 via the bit lines BL0, BL1, . . . , through BLm.

Figure 2:
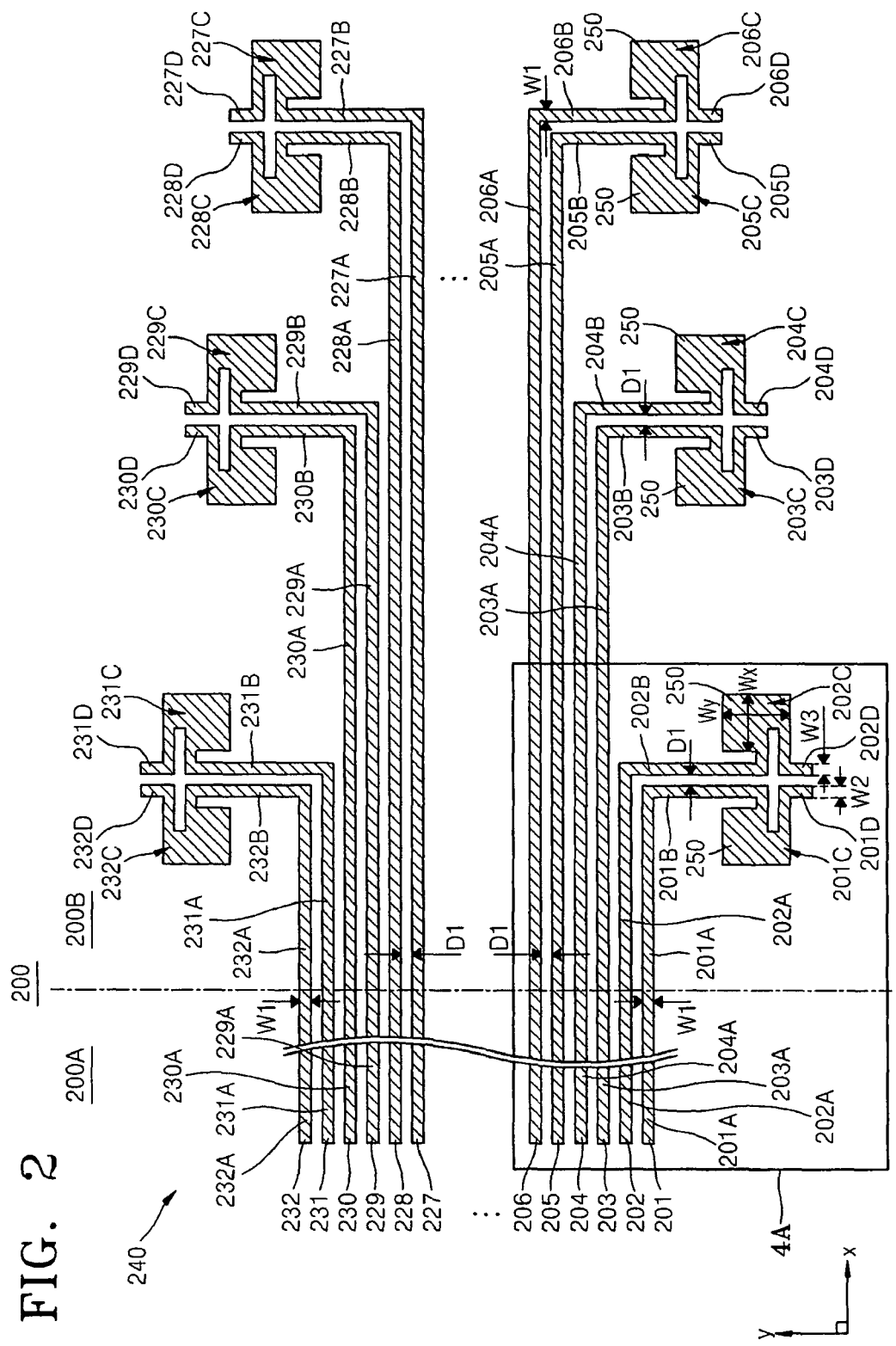
FIG. 2 is a layout diagram of a part of a semiconductor device according to an embodiment of the inventive concept.

FIG. 2 is a layout diagram of a part of a semiconductor device 200 according to an embodiment of the inventive concept. FIG. 2 illustrates the layout of a part of a memory cell region 200A of the semiconductor device 200 which is a NAND flash memory device, and a part of a connection region 200B in which a plurality of conductive lines, e.g., contact pads connecting word lines or bit lines to an external circuit (not shown) such as a decoder in a peripheral circuit region (not shown), are arranged to form a cell array of the memory cell region 200A. The memory cell region 200A may constitute the cell array 32 of FIG. 1.

The memory cell region 200A includes a plurality of memory cell blocks 240 but FIG. 2 illustrates one memory cell block 240, for convenience of description. In the memory cell block 240, a plurality of conductive lines 201, 202, . . . , through 232 for forming one cell string extend in parallel in a first direction (in the X-axis direction in FIG. 2). The conductive lines 201, 202, . . . , through 232 are disposed in both the memory cell region 200A and the connection region 200B.

The conductive lines 201, 202, . . . , through 232 respectively include first line portions 201A, 202A, . . . , through 232A extending in the first direction, and respectively include second line portions 201B, 202B, . . . , through 232B extending from one end of the their corresponding first line portions 201A, 202A, . . . , through 232A in a second direction (in the Y-axis direction in FIG. 2) which is different from the first direction, respectively. The first line portions 201A, 202A, . . . , through 232A are disposed in the memory cell region 200A and the connection region 200B. However, the second line portions 201B, 202B, . . . , through 232B are disposed only in the connection region 200B. Although FIG. 2 illustrates a case where the second direction is perpendicular to the first direction, the inventive concept is not limited thereto.

In the connection region 200B, a plurality of contact pads 201C, 202C, . . . , through 232C are respectively connected to the second line portions 201B, 202B, . . . , through 232B. Also, dummy conductive lines 201D, 202D, . . . , through 232D are respectively connected to the conductive lines 201, 202, . . . , through 232 via the contact pads 201C, 202C, . . . , through 232C. The dummy conductive lines 201D, 202D, . . . , through 232D are respectively connected to the second line portions 201B, 202B, . . . , through 232B to be opposite to one another with respect to the contact pads 201C, 202C, . . . , through 232C.

The conductive lines 201, 202, . . . , through 232 may each have a first width W1. The dummy conductive lines 201D, 203D, . . . , through 231D and the dummy conductive lines 202D, 204D, . . . , through 232D may respectively have widths W2 and W3 that are equal to the first width W1.

In the memory cell region 200A and the connection region 200B, the first line portions 201A, 202A, . . . , through 232A of the conductive lines 201, 202, . . . , through 232 are disposed apart from one another by a predetermined distance, i.e., a first distance D1, in the second direction. In the connection region 200B, the second line portions 201B, 202B, . . . , through 232B may be divided into a pair of the second line portions 201B and 202B, a pair of the second line portions 203B and 204B, . . . , through a pair of the second line portions 231B and 232B, which are adjacent to each other while being spaced apart from each other by the first distance D1. A pair of the contact pads 201C and 202C, a pair of the contact pads 203C and 204C, . . . , through a pair of the contact pads 231C and 232C, which are respectively connected to the pair of the second line portions 201B and 202B, the pair of the second line portions 203B and 204B, . . . , through the pair of the second line portions 231B and 232B, are symmetrical to each other about an imaginary straight line extending between them in the second direction.

Referring to FIG. 2, each of the contact pads 201C, 202C, . . . , through 232C includes a rectangular pattern 250 having a width Wx in the first direction (the X-axis direction in FIG. 2) and a width Wy in the second direction that are each greater than the first width W1 of the conductive lines 201, 202, . . . , through 232.

The pair of the contact pads 201C and 202C, the pair of the contact pads 203C and 204C, . . . , through the pair of the contact pads 231C and 232C are respectively connected to a pair of the dummy conductive lines 201D and 202D, a pair of the dummy conductive lines 203D and 204D, . . . , through a pair of the dummy conductive lines 231D and 232D. The pair of the dummy conductive lines 201D and 202D, the pair of the dummy conductive lines 203D and 204D, . . . , through the pair of the dummy conductive lines 231D and 232D extend in parallel in the second direction to be spaced apart from each other by the first distance D1. Here, the first distance D1 between the pair of the second line portions 201B and 202B, between the pair of the second line portions 203B and 204B, . . . , through between the pair of the second line portions 231B and 232B may be equal to a distance between the pair of the dummy conductive lines 201D and 202D, between the pair of the dummy conductive lines 203D and 204D, . . . , through between the pair of the dummy conductive lines 231D and 232D.

In FIG. 2, the conductive lines 201, 202, . . . , through 232 may be word lines or bit lines that constitute a plurality of memory cells in the memory cell region 200A.

In FIG. 2, the memory cell block 240 of the semiconductor device 20 includes thirty-two conductive lines 201, 202, . . . , through 232 but the inventive concept is not limited thereto, and thus, the total number of conductive lines of the memory cell block 240 is not limited.

FIG. 3 is a layout diagram of a part of a semiconductor device 200 according to another embodiment of the inventive concept. FIG. 3 illustrates the layout of a part of a memory cell region 200A of the semiconductor device 300 which is a NAND flash memory device, and a part of a connection region 200B in which a plurality of conductive lines, e.g., contact pads connecting word lines or bit lines to an external circuit (not shown) such as a decoder in a peripheral circuit region (not shown), are arranged to form a cell array of the memory cell region 300A. The memory cell region 300A may form the cell array 32 of FIG. 1. The memory cell region 200A includes a plurality of memory cell blocks 240 however FIG. 3 illustrates one memory cell block 240, for convenience of description.

The semiconductor device 300 of FIG. 3 is similar to the semiconductor device 200 of FIG. 2, except that in the connection region 300B, each of a plurality of contact pads 301C, 302C, . . . , through 332C includes a concavo-convex line pattern 350 extending from one of a plurality of second line portions 201B, 202B, . . . , through 232B to one of a plurality of dummy conductive lines 201D, 202D, . . . , through 232D. In FIG. 3, reference numerals that are the same as those of FIG. 2 denote the same elements, and thus, a detailed description thereof will not be repeated here.

The concavo-convex line pattern 350 may extend having the same first width W1 as each of the second line portions 201B, 202B, . . . , through 232B along the longitudinal direction thereof.

A pair of the contact pads 301C and 302C, a pair of the contact pads 303C and 304C, . . . , through a pair of the contact pads 331C and 332C are respectively connected to a pair of the dummy conductive lines 201D and 202D, a pair of the dummy conductive lines 203D and 204D, . . . , through a pair of the dummy conductive lines 231D and 232D. The pair of the dummy conductive lines 201D and 202D, the pair of the dummy conductive lines 203D and 204D, . . . , through the pair of the dummy conductive lines 231D and 232D, extend in parallel in the second direction (in the Y-axis direction in FIG. 3) to be spaced apart from each other by the distance D1.

The pair of the contact pads 301C and 302C, the pair of the contact pads 303C and 304C, . . . , through the pair of the contact pads 331C and 332C that are respectively connected to a pair of the second line portions 201B and 202B, a pair of the second line portions 203B and 204B, and a pair of the second line portions 231B and 232B, are symmetrical to each other about an imaginary straight line extending between them in the second direction. Spaces S1, S2 and S3 defined by each concave-convex line pattern 350 the pairs of the concavo-convex line patterns 350 that respectively constitute the pair of the contact pads 301C and 302C, the pair of the contact pads 303C and 304C, . . . , through the pair of the contact pads 331C and 332C, may be less than or equal to the first distance D1 between the pair of the dummy conductive lines 201D and 202D, the pair of the dummy conductive lines 203D and 204D, . . . , through the pair of the dummy conductive lines 231D and 232D.

FIGS. 4A through 15B are plan and cross-sectional views illustrating a method of forming patterns of a semiconductor device, e.g., the semiconductor device 200 of FIG. 2, according to an embodiment of the inventive concept.

Figure 4A:
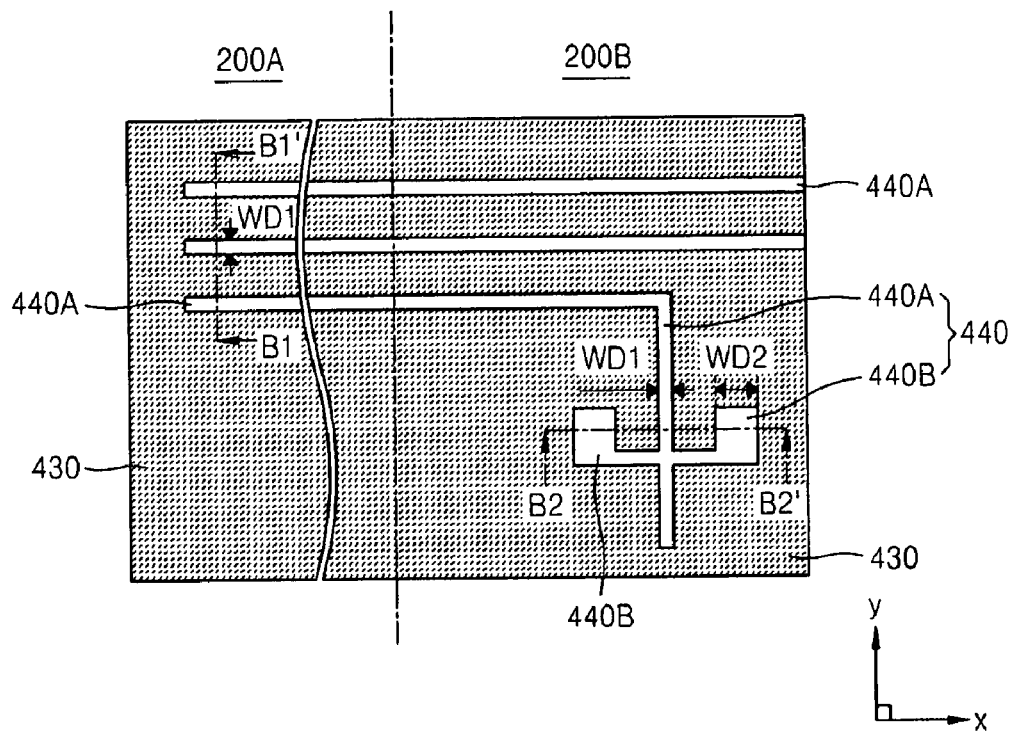
FIGS. 4A through 15B are plan and cross-sectional views illustrating a method of forming patterns of a semiconductor device, according to an embodiment of the inventive concept.
Figure 4B:
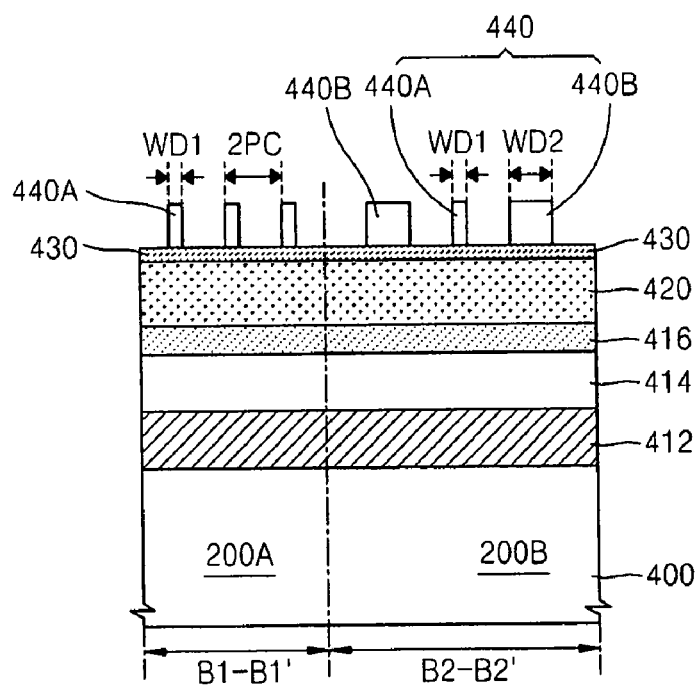
Figure 5A:
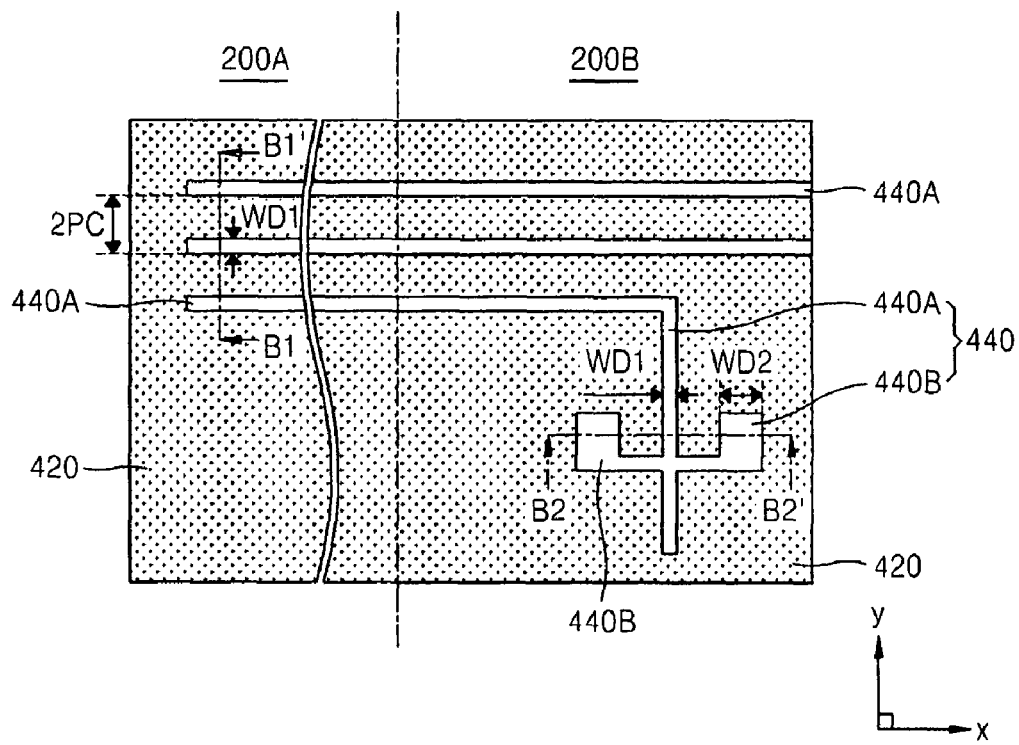
Figure 5B:
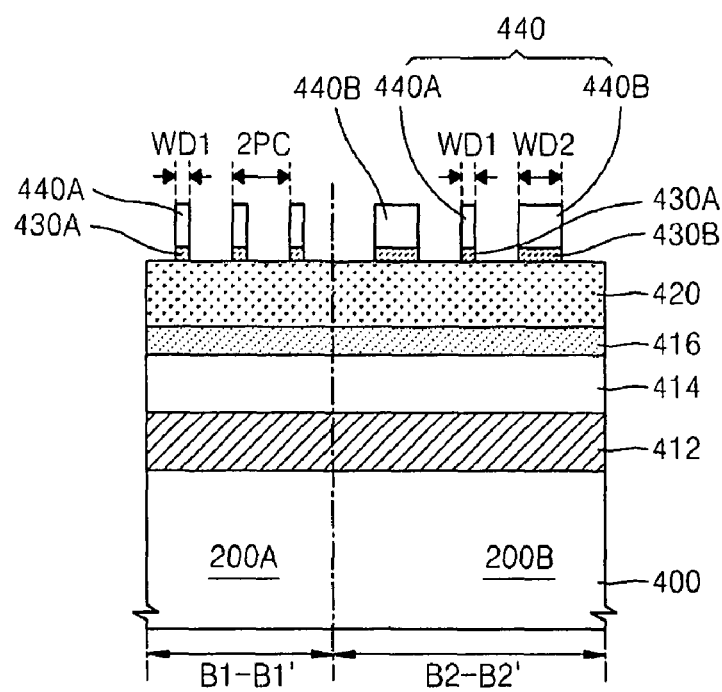

In particular, FIGS. 4A, 5A, . . . , through 15A are respectively plan views of a block 4A in FIG. 2. FIGS. 4B, 5B, . . . , through 15B are cross-sectional views respectively taken along a line B1-B1' and a line B2-B2' of FIGS. 4A, 5A, . . . 15A.

Referring to FIGS. 4A and 4B, a substrate 400 including the memory cell region 200A and the connection region 200B of FIG. 2 is prepared.

In the memory cell region 200A and the connection region 200B, a conductive layer 412 is formed on the substrate 400, for example, in order to obtain the conductive lines 201, 202, . . . , through 232 of FIG. 2, and a hard mask layer 414 and a buffer mask layer 416 are sequentially formed on the conductive layer 412. Then, a dual mask layer 420 and a variable mask layer 430 are sequentially formed on the buffer mask layer 416, and a mask pattern 440 is formed on the variable mask layer 430.

The mask pattern 440 includes a first mask portion 440A and a second mask portion 440B. Also, a plurality of the first mask portions 440A are formed to extend from the memory cell region 200A to the connection region 200B. The first mask portions 440A are formed in stripes and at regular pitches in the memory cell region 200A. The second mask portion 440B is formed in the connection region 200B.

In the memory cell region 200A and the connection region 200B, the first mask portions 440A may be formed to have a first pitch 2PC that is double a fine pitch PC of a minute pattern that is to be finally obtained. Also, in the memory cell region 200A and the connection region 200B, a fine width WD1 of each of the first mask portions 440A formed in a narrow pattern may be equal to the first distance D1 between, for example, the conductive lines 201, 202, . . . , through 232 of FIG. 2, which is a pattern to be finally formed on the substrate 400.

The second mask portion 440B, formed as a relative wide pattern in the connection region 200B, is formed to have a width less than the width of the pattern that is to be finally formed. For example, in order to obtain the contact pads 201C, 202C, . . . , through 232C of FIG. 2, the second mask portion 440B is formed to have a width WD2 which is less than the width Wx of each of the contact pads 201C, 202C, . . . , through 232C, as illustrated in the cross-sectional view taken along the line B2-B2' of FIG. 4B. The greater the difference between the width WD2 of the second mask portion 440B and the fine width WD1 of the first mask portion 440A, the greater the effect caused by the difference between the amounts of etching according to a three-dimensional (3D) etching effect used in the method according to the inventive concept, as will be described later with reference to FIGS. 6A and 6B. The first mask portion 440A and the second mask portion 440B may be simultaneously formed by performing a photolithography process once by using one photo mask.

The substrate 400 may be a general semiconductor substrate, such as a silicon substrate.

The conductive layer 412 may be doped with polysilicon, metal, a metal nitride, or a combination thereof. For example, when word lines are formed using the conductive layer 412, the conductive layer 412 may include a material selected from the group consisting of TaN, TiN, W, WN, HfN and a tungsten silicide, or a conductive material of a combination thereof. Also, when bit lines are formed using the conductive layer 412, the conductive layer 412 may be doped with polysilicon or metal.

The hard mask layer 414 may be a single layer or have a multi-layer structure in which a plurality of hard mask layers having different etching characteristics are stacked under predetermined etching conditions. The hard mask layer 414 may be an oxide layer, a nitride layer, or a combination thereof. For example, the hard mask layer 414 may be an oxide layer, and the buffer mask layer 416 may be a polysilicon layer or a nitride layer but the inventive concept is not limited thereto. The hard mask layer 414 and the buffer mask layer 416 may be respectively formed of materials having different etching characteristics under predetermined etching conditions. In some cases, the buffer mask layer 416 may be omitted. The hard mask layer 414 may be formed to a thickness of about 1000 to about 3000 Å, and the buffer mask layer 416 may be formed to a thickness of about 300 to about 1000 Å.

In the memory cell region 200A and the connection region 200B, a first portion of the dual mask layer 420 on which the first mask portion 440A is to be formed, may be used as a sacrificial layer for increasing the pattern density of the first mask portion 440A. In the connection region 200B, a part of an etch mask may be formed by a second portion of the dual mask layer 420 on which the second mask portion 440B is to be formed, in order to obtain a desired pattern on the second portion of the dual mask layer 420.

The dual mask layer 420 may be formed of various types of materials according to the type of the buffer mask layer 416. For example, the dual mask layer 420 may be an amorphous carbon layer (ACL) or a carbon-containing layer. Alternatively, the dual mask layer 420 may be formed of a silicon-containing material selected from the group consisting of $SiO_2$, $Si_3N_4$, SiCN, and polysilicon and a combination thereof.

The dual mask layer 420 may be formed using a spin coating process or a chemical vapor deposition (CVD) process. For example, a process of forming the dual mask layer 420 by using a carbon-containing material will be described. First, an organic compound is applied to a thickness of about 1000 to about 5000 Å on the buffer mask layer 416 using a spin coating process, a CVD process, or another process. The organic compound may be formed of a hydrocarbon compound containing an aromatic ring, such as phenyl, benzene, and naphthalene, or a derivative thereof The organic compound may be formed of a material having a relatively high carbon content of about 85 to about 99% by weight of the total weight of the organic compound. A carbon-containing layer may be obtained by baking the organic compound at a temperature of about 150 to about 350° C. in a first baking process. The first baking process may be performed for about sixty seconds. Then, the carbon-containing layer is baked, in a second baking process, at a temperature of about 300 to about 550° C. to be hardened. The second baking process may be performed for about 30 to about 300 seconds. The carbon-containing layer is hardened through the second baking process in order to prevent the carbon-containing layer from deteriorating even when another layer is stacked on the carbon-containing layer at a relatively high temperature, e.g., about 400° C. or more.

The variable mask layer 430 is formed to variably function as an etch mask for the dual mask layer 420, according to the widths WD1 and WD2 of the first mask portion 440A and second mask portion 440B of the mask pattern 440 on the variable mask layer 430. The thickness of the variable mask layer 430 may be determined sufficiently thick enough to cause the 3D etching effect (which will be described later with reference to FIGS. 6A and 6B), in consideration of a material of the variable mask layer 430, etch conditions of a subsequent process of etching the dual mask layer 420 (which will also be described later with reference to FIGS. 6A and 6B), the width WD1 of the first mask portion 440A, and the width WD2 of the second mask portion 440B.

The variable mask layer 430 may be formed of a material having an etch selectivity with respect to the dual mask layer 420 so that the variable mask layer 430 may be used as an etch mask for the dual mask layer 420. For example, the variable mask layer 430 may be formed of a silicon-containing material selected from the group consisting of SiON, $SiO_2$, $Si_3N_4$, SiCN, and polysilicon, and a combination thereof. Otherwise, the variable mask layer 430 may be formed of a metal or organic material.

The mask pattern 440 may be formed, for example, using a photolithography process. The mask pattern 440 may be a photoresist layer, or may have a stacked structure of an anti-reflecting layer, formed of an organic or inorganic material, and a photoresist layer.

In the mask pattern 440, the width WD1 of the first mask portion 440A may be 1 F, which is the minimum feature size of a semiconductor device that is to be obtained, and the width WD2 of the second mask portion 440B may be greater than the minimum feature size. For example, the width WD1 of the first mask portion 440A may range from several nm to several tens of nm.

Referring to FIGS. 5A and 5B, the variable mask layer 430 is etched using the mask pattern 440 as an etch mask in order to form first and second variable mask patterns 430A and 430B in the memory cell region 200A and the connection region 200B.

The first variable mask pattern 430A is located below the first mask portions 440A, and the second variable mask pattern 430B is located below the second mask portion 440B.

The width of the mask pattern 440 is transcribed onto the variable mask layer 430, and thus, the first variable mask pattern 430A may have a width equal to the width WD1 of the first mask portion 440A and the second variable mask pattern 430B may have a width equal to the width WD2 of the second mask portion 440B.

The thickness of the mask pattern 440 may decrease while the variable mask layer 430 is etched to form the first variable mask pattern 430A and the second variable mask pattern 430B.

Figure 6A:
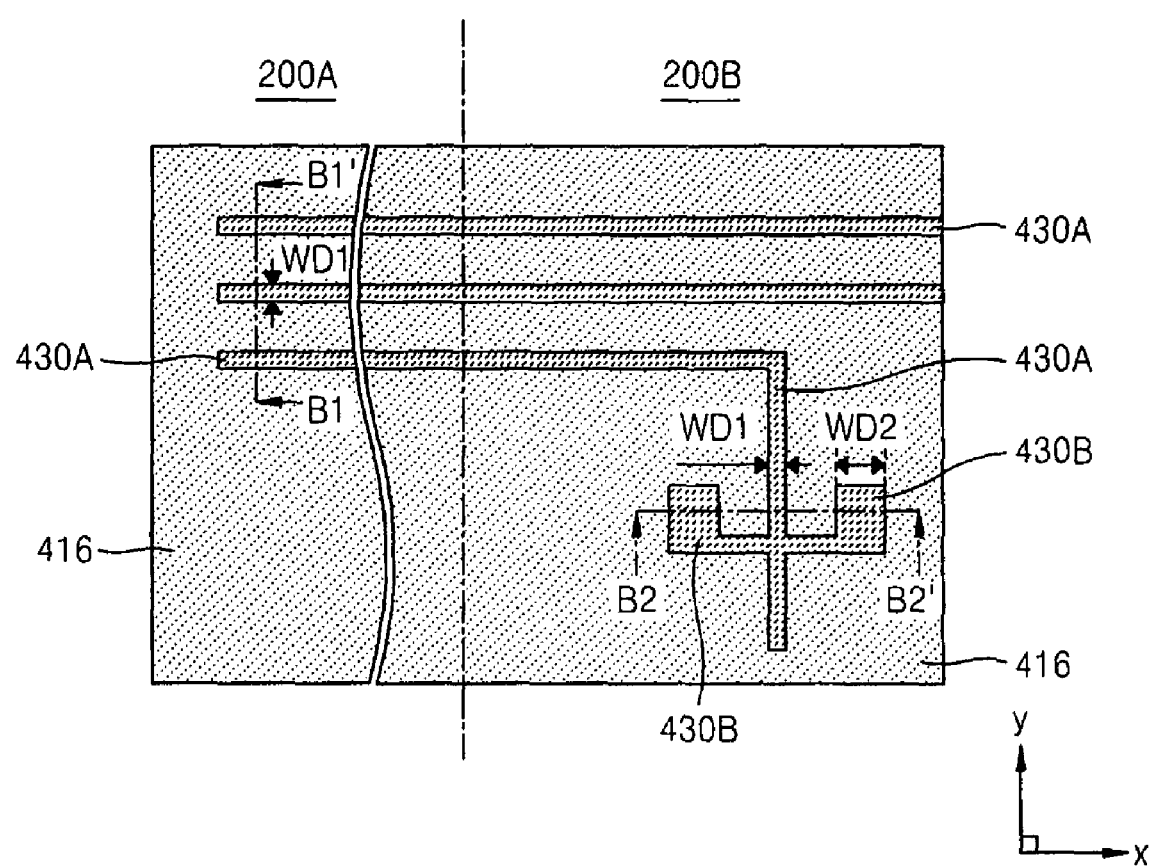

Referring to FIGS. 6A and 6B, after the mask pattern 440 is removed, first and second mask patterns 420A and 420B that are respectively disposed below the first and second variable mask patterns 430A and 430B are formed by etching the dual mask layer 420 by using the first and second variable mask patterns 430A and 430B as etch masks until the buffer mask layer 416 is exposed.

While the dual mask layer 420 is etched, the first variable mask pattern 430A and the second variable mask pattern 430B are influenced under an etch atmosphere in various directions including perpendicular and diagonal directions with respect to the direction in which a main surface of the substrate 400 extends, as indicated in blocks NARROW and WIDE in FIG. 6B with arrows a1, b1, c1, a2, b2, and c2. As a result, the sidewalls of the first variable mask pattern 430A have inclined etch surfaces S1 and the sidewalls of the second variable mask pattern 430B have inclined etch surfaces S2 as illustrated in FIG. 6B. In this case, the fine width WD1 of the first variable mask pattern 430A is less than the width W2 of the second variable mask pattern 430B. Thus, after the inclined etch surface S1 is formed, as the inclined etch surface S1 becomes continuously abraded in the diagonal directions indicated with the arrows a1 and b1 or in other directions, the inclined surfaces S1 of the sidewalls of the first variable mask pattern 430A meet each other at a top surface of the first variable mask pattern 430A within a short period of time. Accordingly, abrasion of the top surface of the first variable mask pattern 430A is accelerated in the perpendicular direction indicated with the arrow c1 as the amount of abrasion of the sidewalls of the first variable mask pattern 430A increases (hereinafter, referred to as 'the 3D etch effect'). However, since the width WD2 of the second variable mask pattern 430B is greater than the width WD1 of the first variable mask pattern 430A, after the inclined etch surface S2 is formed, the amount of abrasion of the top surface of the second variable mask pattern 430B in the perpendicular direction indicated with the arrow c2 until etching of the dual mask layer 420 is completed, is far less than the amount of abrasion of the first variable mask pattern 430A in the perpendicular direction indicated with the arrow c1 according to the 3D etch effect, even when the inclined etch surface S2 is continuously abraded in the diagonal directions indicated with the arrows a2 and b2 and other directions.

Thus, after the first mask pattern 420A and the second mask pattern 420B are formed, the thickness TA1 of the first variable mask pattern 430A that remains on the first mask pattern 420A is less than the thickness TB1 of the second variable mask pattern 430B that remains on the second mask pattern 420B. The greater the difference between the width WD2 and the width WD1, the greater the difference between the thickness TA1 of the first variable mask pattern 430A and the thickness TB1 of the second variable mask pattern 430B.

In the process illustrated in FIGS. 6A and 6B, a dry etch process may be used to etch the dual mask layer 420. For example, when the dual mask layer 420 is a carbon-containing layer described above with reference to FIGS. 4A and 4B, a plasma etch process using a mixture of an $O_2$ gas and an argon (Ar) gas may be performed to etch the dual mask layer 420.

Figure 7A:
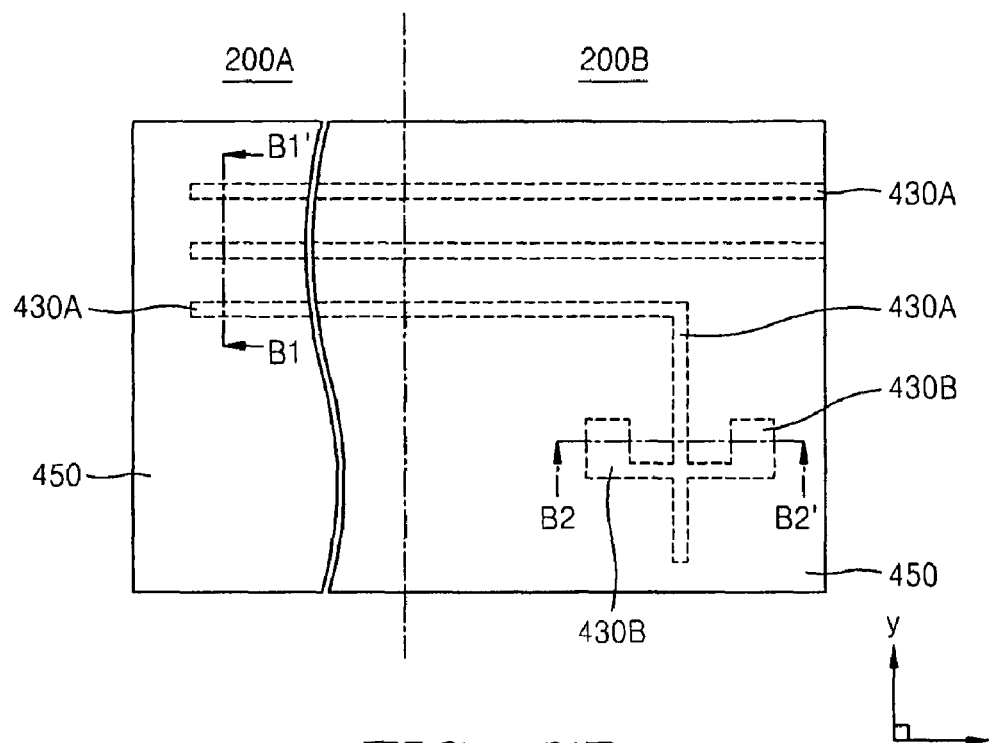
Figure 7B:
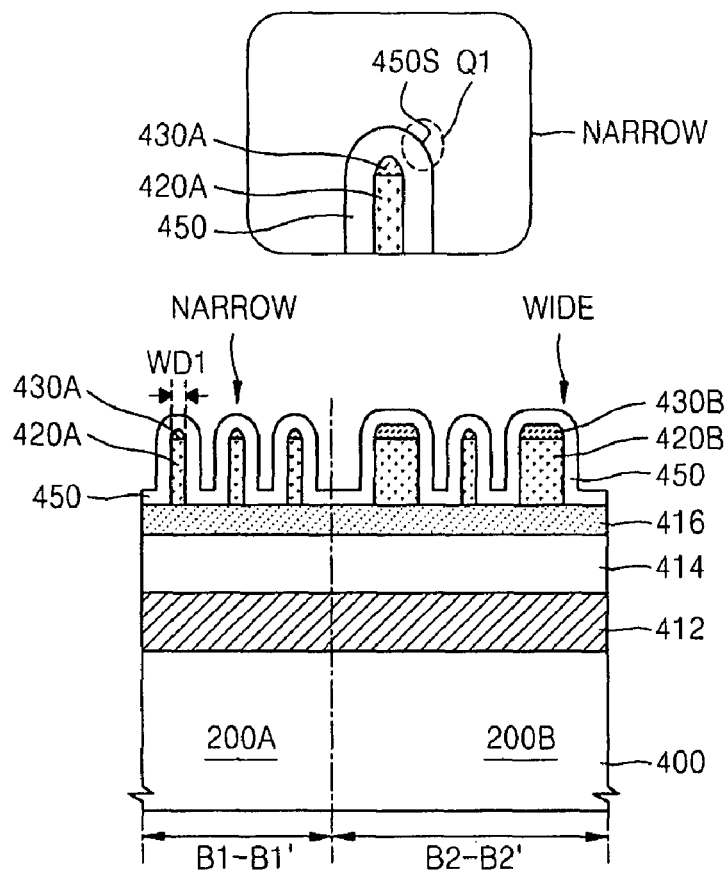

Referring to FIGS. 7A and 7B, a spacer mask layer 450 is formed to evenly cover the entire exposed surface of the resultant structure in which the first variable mask pattern 430A remains on the first mask pattern 420A and the second variable mask pattern 430B remains on the second mask pattern 420B. An upper surface of the spacer mask layer 450 on one of the inclined etch surfaces S1 of the first variable mask pattern 430A, which is indicated with a dotted circle Q1 in FIG. 7B, has an inclined surface 450S corresponding to the degree of inclination of the inclined etch surface S1. The inclined surface 450S of the spacer mask layer 450 may be useful for performing an etch process in order to form a plurality of first spacers 450A which will be described later with reference to FIGS. 8A and 8B.

The spacer mask layer 450 may be formed of a material having etch selectivity with respect to the first and second variable mask patterns 430A and 430B and the buffer mask layer 416. For example, the spacer mask layer 450 may be an oxide layer. An atomic layer deposition (ALD) process may be used to evenly form the spacer mask layer 450 on the substrate 400.

Figure 8A:
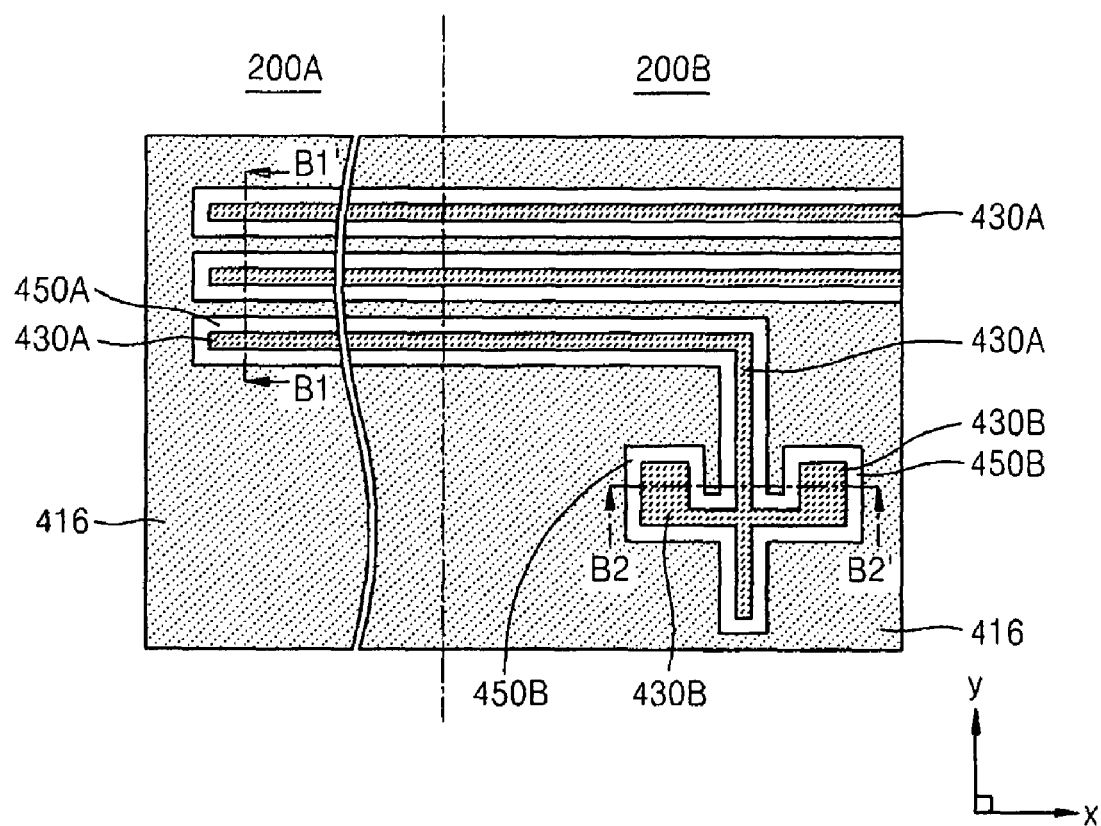

Referring to FIGS. 8A and 8B, the first spacers 450A and a plurality of second spacers 450B are obtained by etching the spacer mask layer 450 until a top surface of the buffer mask layer 416 is exposed. The first spacers 450A cover the sidewalls of the first mask pattern 420A and the second spacers 450B cover the sidewalls of the second mask pattern 420B.

The first spacers 450A may function as an etch mask in order to increase the pattern density of the memory cell region 200A, and the second spacers 450B may function as a part of an etch mask used to form a wide pattern in the connection region 200B, where the width of the wide pattern is greater than that of the pattern in the memory cell region 200A. In the memory cell region 200A, the width SW1 of the first spacer 450A may be equal to the first width W1 of each of the conductive lines 201, 202, . . . , through 232 of FIG. 2.

While the spacer mask layer 450 is etched back, etching of the spacer mask layer 450 is accelerated on the first mask pattern 420A due to the inclined surface 450S of the spacer mask layer 450, and the etch rate of the spacer mask layer 450 on the first mask pattern 420A may be greater than that of the spacer mask layer 450 on the second mask pattern 420B. After the first and second spacers 450A and 450B are formed, the reduction rate in the thickness TA2 of the first variable mask pattern 430A remaining on the first mask pattern 420A becomes greater than the reduction rate in the thickness TB2 of the second variable mask pattern 430B remaining on the second mask pattern 420B. Thus, the difference between the thickness TB2 of the second variable mask pattern 430B and the thickness TA2 of the first variable mask pattern 430A may increase. The height H1 of the first spacer 450A may be less than the height H2 of the second spacer 450B. Thus, the first variable mask pattern 430A and the first spacers 450A are apart from each other by a distance DA1, and a portion of the first mask pattern 420A may be exposed between the first variable mask pattern 430A and the first spacers 450A due to the distance DA1.

On the second mask pattern 420B, the etch rate of the spacer mask layer 450 on the sidewall of the second variable mask pattern 430B is less than that of the inclined surface 450S of the spacer mask layer 450 on the first mask pattern 420A. As a result, the height H2 of the second spacer 450B from the top surface of the buffer mask layer 416 is far greater than the distance DM between the top surface of the buffer mask layer 416 and the bottom surface of the second variable mask pattern 430B, and thus, a portion of the second spacer 450B may contact the second variable mask pattern 430B as indicated with a dotted circle Q2 in FIG. 8B. Accordingly, the second mask pattern 420B may not be exposed to the outside since it is entirely covered with the second spacers 450B and the second variable mask pattern 430B.

In the process of FIGS. 8A and 8B, the spacer mask layer 450 may be etched, for example, using a CxFy gas or a CHxFy gas as a main etch gas (x and y are integers in the range of 1 to 10). Otherwise, a mixture of the main etch gas and at least one gas selected from the group of an $O_2$ gas and an Ar gas, may be used. For example, the CxFy gas may be a $C_3F_6$, $C_4F_6$, $C_4F_8$, or $C_5F_8$ gas, and the CHxFy gas may be a $CHF_3$ or $CH_2F_2$ gas. Here, the $O_2$ gas added to the main etch gas not only removes a polymer by-product produced in the etch process but also dissolves the CxFy etch gas. The Ar gas which is also added to the main etch gas is used as a carrier gas, and causes ion bombarding. The spacer mask layer 450 may be etched under a plasma atmosphere by generating plasma of an etch gas selected from the above etch gases in an etch chamber. In some cases, the spacer mask layer 450 may be etched under the above etch gas atmosphere having no ion energy by generating plasma in the etch chamber. For example, a mixture of the $C_4F_6$, $CHF_3$, $O_2$, and Ar gases may be used as an etch gas in order to etch the spacer mask layer 450. In this case, a plasma-based dry etch process may be performed under a pressure of about 30 mT for several seconds to several tens of seconds while supplying the $C_4F_6$, $CHF_3$, $O_2$, and Ar gases so that the cubic volumes of the $C_4F_6$, $CHF_3$, $O_2$, and Ar gases may be in the ratio of about 1:6:2:14.

In the process of FIGS. 8A and 8B, in order to etch the spacer mask layer 450 under etch conditions where the amount of polymer by-products produced is large, when an etch gas is selected from the $C_4F_6$, $CHF_3$, $O_2$, and Ar gases, the amount of polymer by-products produced may be increased by reducing the flow rate of the $O_2$ gas so that the content of the $O_2$ gas contained in the etch gas is reduced. Otherwise, the amount of polymer by-products produced may be increased by lowering the etch temperature. Otherwise, the amount of polymer by-products produced may be increased by reducing the content of the $O_2$ gas in the etch gas and lowering the etch temperature. When the spacer mask layer 450 is etched under the etch conditions where the amount of polymer by-products produced is large as described above, for example, CxFy-based polymer by-products may accumulate on a relatively wide pattern, such as the second variable mask pattern 430B, to obtain a polymer by-product layer (not shown).

Figure 9A:
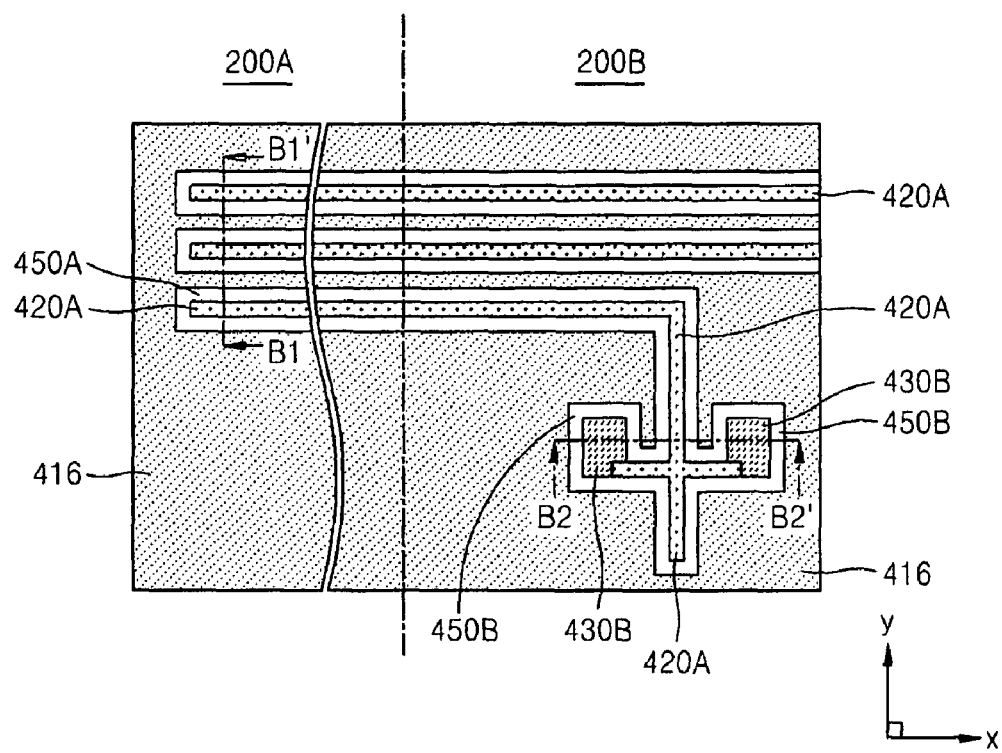
Figure 9B:
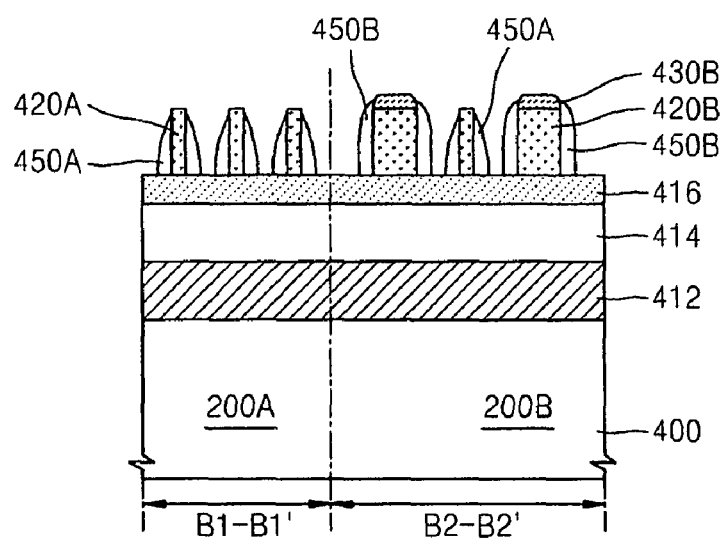

Referring to FIGS. 9A and 9B, the first variable mask pattern 430A is selectively removed in order to expose the top surface of the first mask pattern 420A.

Since the size and thickness of the first variable mask pattern 430A are less than those of the second variable mask pattern 430B, the etch rate of the first variable mask pattern 430A is greater than that of the second variable mask pattern 430B although the first variable mask pattern 430A and the second variable mask pattern 430B are formed of the same material. Thus, when the first variable mask pattern 430A is completely removed in the memory cell region 200A and the connection region 200B, the second variable mask pattern 430B in the connection region 200B remains on the second mask pattern 420B without being reduced in thickness.

After the first variable mask pattern 430A is removed, the first mask pattern 420A disposed below the first variable mask pattern 430A is exposed.

A dry or wet etch process may be used to remove the first variable mask pattern 430A. For example, when the first variable mask pattern 430A is formed of SiON or $Si_3N_4$, a CHxFy gas may be used as a main etch gas to remove the first variable mask pattern 430A (x and y are integers in the range of 1 to 10). Otherwise, a mixture of a CxFy gas and a CHxFy gas may be used as the main etch gas. An $O_2$ gas, an Ar gas, or a halogen-based compound may further be used if needed. For example, in order to remove the first variable mask pattern 430A, a mixture of $CH_2F_2$, $CHF_3$, $O_2$, and Ar gases may be used as an etch gas. In this case, the plasma-based dry etch process may be performed under a pressure of about 40 mT for several seconds to several tens of seconds while these gases are supplied so that the cubic volumes of the $CH_2F_2$, $CHF_3$, $O_2$, and Ar gases are in the ratio of about 4:1:5:9.

The first variable mask pattern 430A may be removed right after performing the process of etching the spacer mask layer 450 for forming the first and second spacers 450A and 450B as illustrated in FIGS. 8A and 8B. In this case, the first variable mask pattern 430A may be removed in-situ in the same chamber and etch conditions that are used to etch the spacer mask layer 450. In this case, it is also possible to obtain the effect described above with reference to FIGS. 9A and 9B.

Figure 10A:
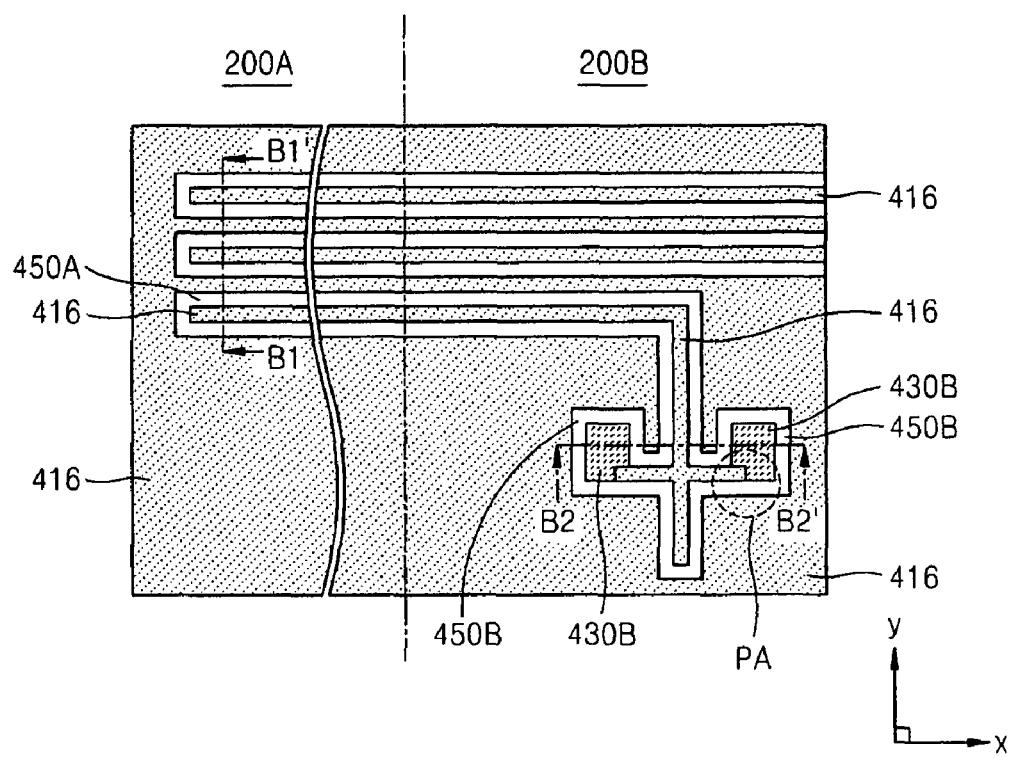
Figure 10B:
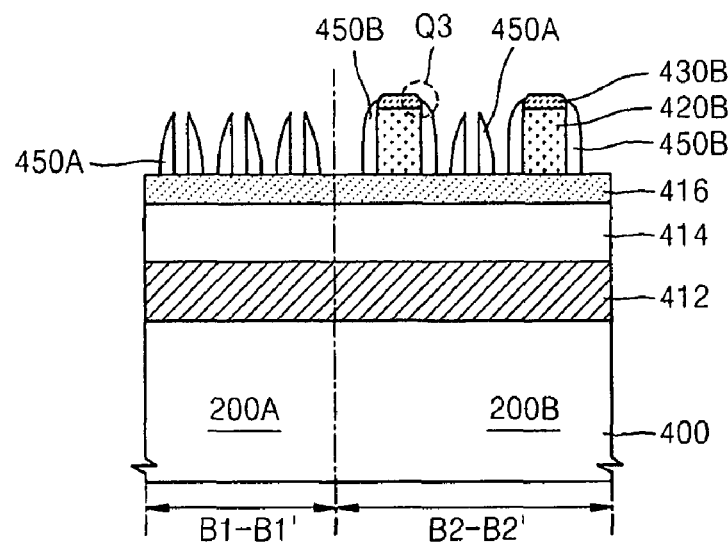

Referring to FIGS. 10A and 10B, the exposed first mask pattern 420A is removed from the memory cell region 200A and the connection region 200B in order to expose the buffer mask layer 416 via a space between two adjacent first spacers 450A of the first spacers 450.

The first mask pattern 420A may be removed using an isotropical etch process.

Since the second spacers 450B and the second variable mask pattern 430B partially contact each other on the second mask pattern 420B as indicated with a dotted circle Q3 in FIG. 10B, the second mask pattern 420B is not exposed since it is entirely covered by the second spacers 450B and the second variable mask pattern 430B. Thus, when the first mask pattern 420A is removed, the top surface and sidewalls of the second mask pattern 420B may be protected by the second variable mask pattern 430B and the second spacers 450B.

By removing the first mask pattern 420A under isotropical etch conditions, only the second mask pattern 420B, which is a relatively wide pattern, may remain from among the first and second mask patterns 420A and 420B. Referring to FIG. 10A, a part of the second mask pattern 420B that contacts the first mask pattern 420A may be partially removed during the isotropical etching in portions as indicated with a dotted line PA.

The process of removing the first mask pattern 420A may be performed under conditions where etching of the first and second spacers 450A and 450B, the second variable mask pattern 430B, and the buffer mask layer 416 is controlled.

If the first mask pattern 420A is formed of the carbon-containing layer described above with reference to FIGS. 4A and 4B, the first mask pattern 420A may be removed, for example, using ashing and strip processes. Otherwise, the first mask pattern 420A may be removed using a dry or wet etch process.

Figure 11A:
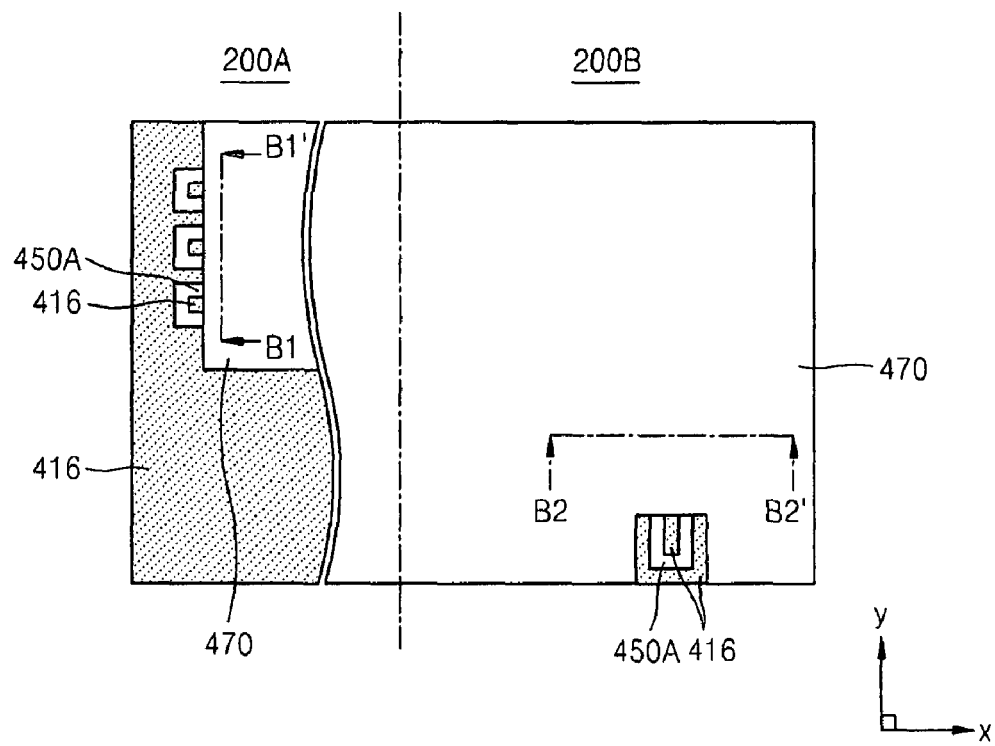
Figure 11B:
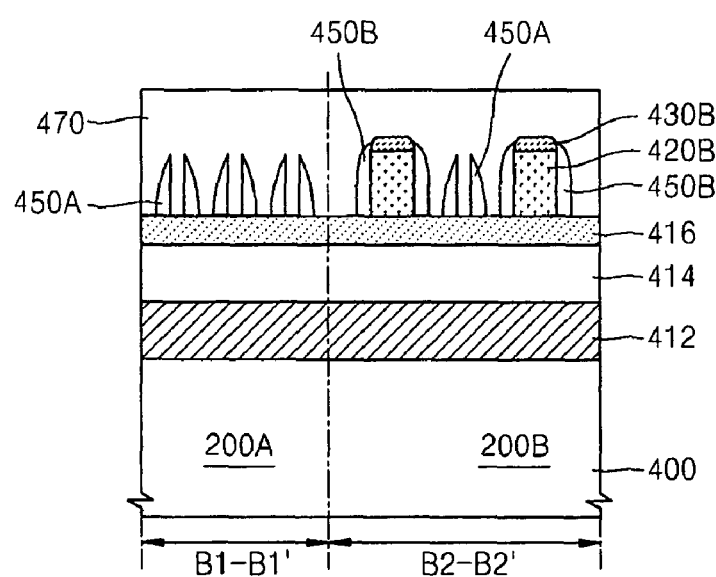

Referring to FIGS. 11A and 11B, a trimming mask pattern 470 is formed on the first and second spacers 450A and 450B in the memory cell region 200A and the connection region 200B, and exposes parts of the first spacers 450A in the memory cell region 200A and the connection region 200B.

The trimming mask pattern 470 may be a photoresist pattern.

Figure 12A:
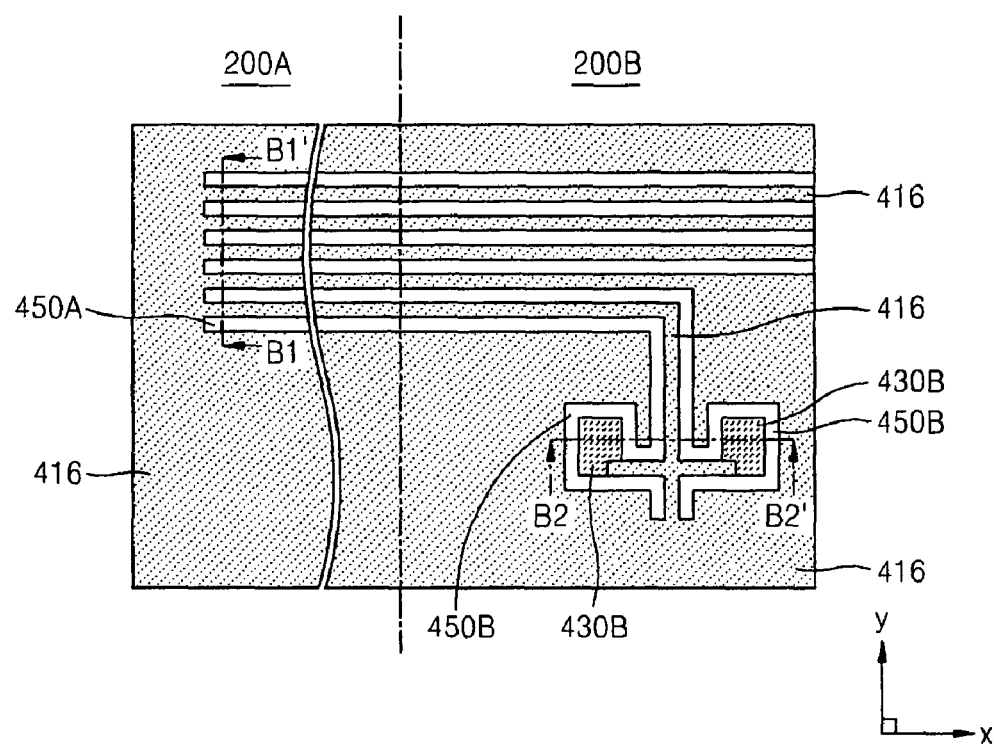
Figure 12B:
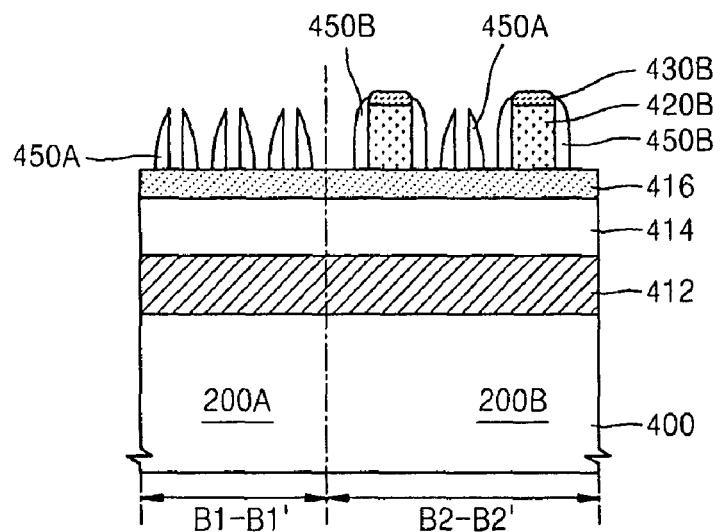

Referring to FIGS. 12A and 12B, a trimming process is performed to etch the exposed portions of the first spacers 450A in the memory cell region 200A and the connection region 200B, by using the trimming mask pattern 470 as an etch mask. As a result, each of the first and second spacers 450A and 450B that were connected to each other in a loop form in the memory cell region 200A and the connection region 200B of the substrate 400 is divided into two parts.

Next, the trimming mask pattern 470 is removed.

Figure 13A:
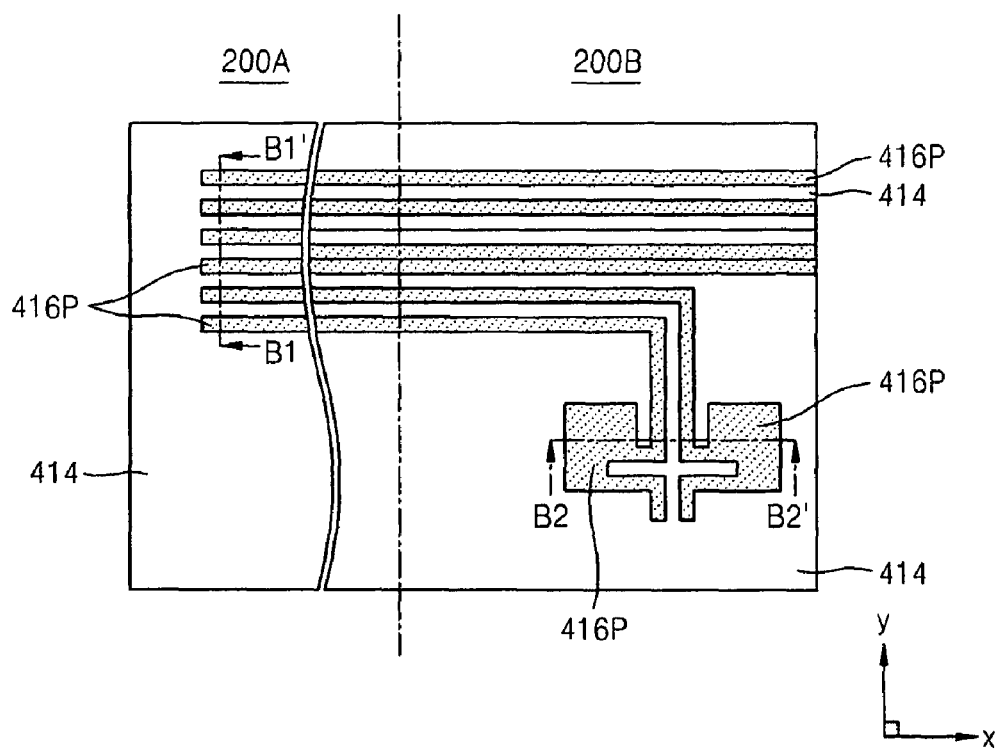
Figure 13B:
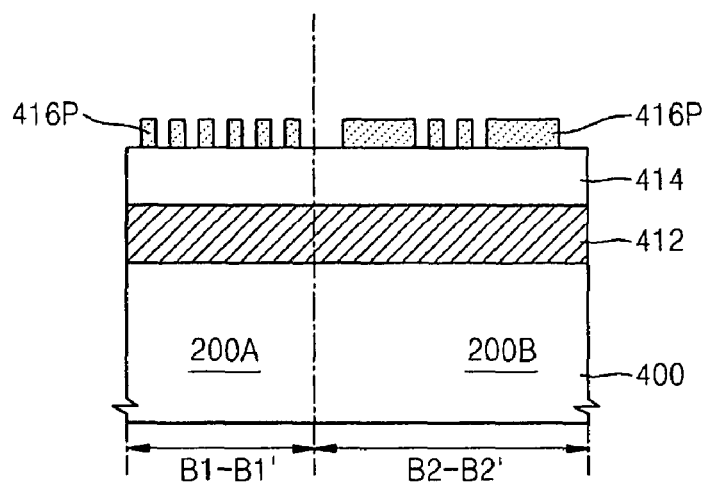

Referring to FIGS. 13A and 13B, a plurality of buffer mask patterns 416P are formed in the memory cell region 200A and the connection region 200B by etching the buffer mask layer 416 by using as etch masks the first and second spacers 450A and 450B in the memory cell region 200A and the connection region 200B and the second variable mask pattern 430B in the connection region 200B until the hard mask layer 414 is exposed. Thus, the hard mask layer 414 is exposed through the mask patterns 416P.

Although not illustrated in FIGS. 13A and 13B, after the buffer mask patterns 416P are formed, residual portions of the first and second spacers 450A and 450B and a portion of the second variable mask pattern 430B may remain on the buffer mask patterns 416P.

Figure 14A:
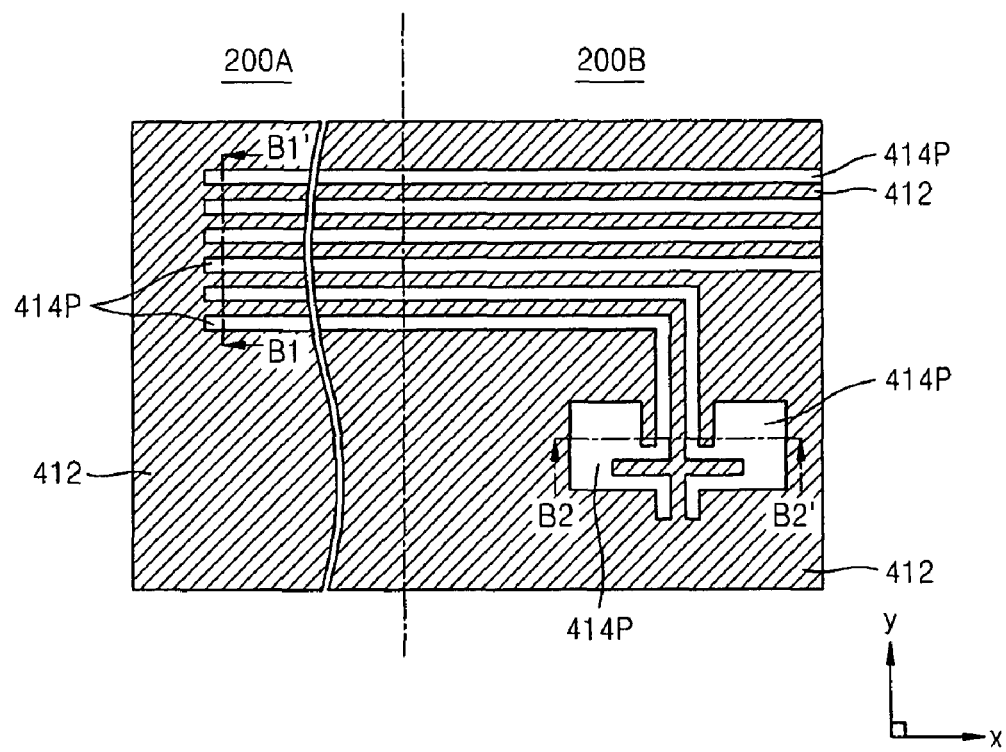
Figure 14B:
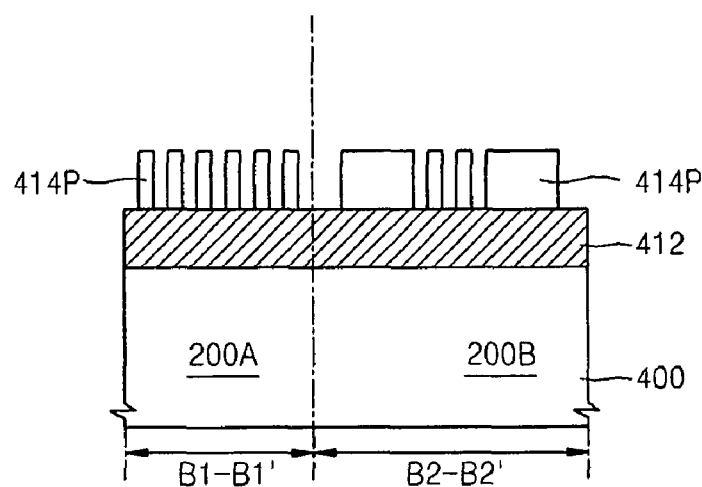

Referring to FIGS. 14A and 14B, a plurality of hard mask patterns 414P are formed in the memory cell region 200A and the connection region 200B by etching the hard mask layer 414 by using the buffer mask patterns 416P as etch masks in the memory cell region 200A and the connection region 200B until the conductive layer 412 is exposed. Thus, the conductive layer 412 is exposed through the hard mask patterns 414P.

Although not illustrated in the drawings, after the hard mask patterns 414P are formed, portions of the buffer mask pattern 416P may remain on the hard mask patterns 414P.

Figure 15A:
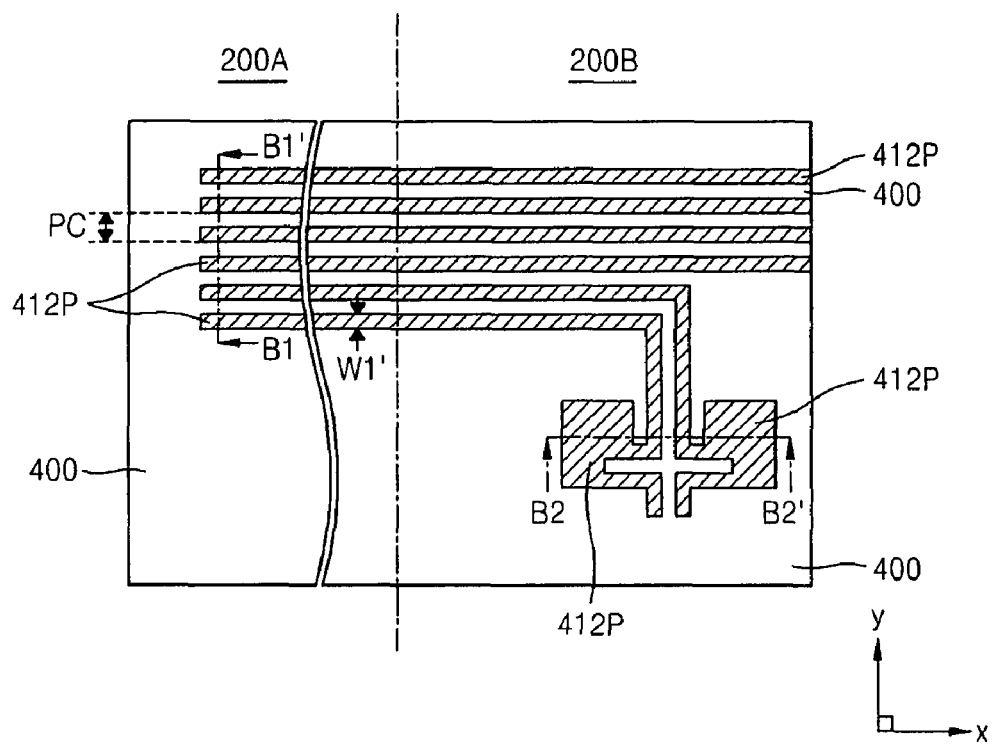
Figure 15B:
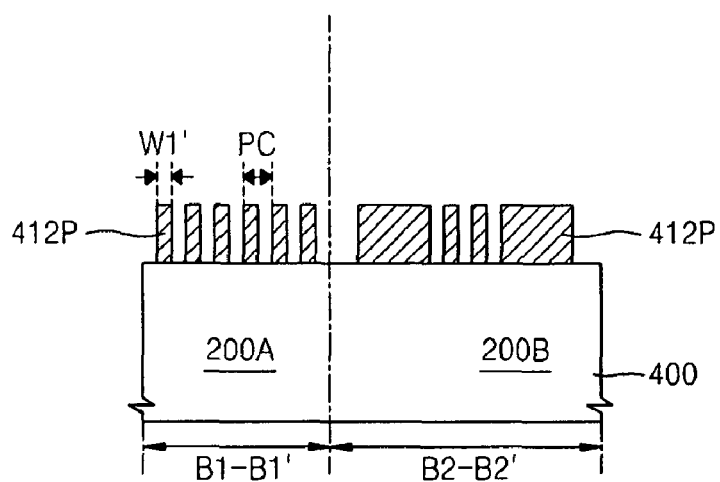

Referring to FIGS. 15A and 15B, a plurality of conductive patterns 412P are formed in the memory cell region 200A and the connection region 200B by etching the conductive layer 412 by using the hard mask patterns 414P as etch masks in the memory cell region 200A and the connection region 200B until the substrate 400 is exposed. Thus, the substrate 400 is exposed through the conductive patterns 412P.

Although not illustrated in the drawings, after the conductive patterns 412P are formed, portions of the hard mask pattern 414P may remain on the conductive patterns 412P.

The conductive patterns 412P may be used to form the conductive lines 201, 202, ..., through 232, the contact pads 201C, 202C, ..., through 232C, and the dummy conductive lines 201D, 202D, ..., through 232D of the semiconductor device 200 illustrated in FIG. 2. In the memory cell region 200A, the conductive patterns 412P may each have a width W1' which is one quarter of the first pitch 2PC described above with reference to FIGS. 4A and 4B. The conductive patterns 412P may have the fine pitch PC, which is half the first pitch 2PC.

In the method described with reference to FIGS. 4A through 15B, a double patterning process may be performed using the first spacers 450A formed on the sidewalls of the first mask pattern 420A as etch masks in order to form the conductive lines 201, 202, ..., through 232 of FIG. 2 having fine widths and increased pattern density on a location where a narrow pattern is to be formed on the substrate 400 in the memory cell region 200A and the connection region 200B. Also, in the connection region 200B of the substrate 400, the contact pads 201C, 202C, ..., through 232C of FIG. 2 are formed to be connected to the conductive lines 201, 202, ..., through 232 and to have a relatively large width, simultaneously with the forming of the conductive lines 201, 202, ..., through 232. The conductive lines 201, 202, ..., through 232 and the contact pads 201C, 202C, ..., through 232C, the widths of which are different from one another, are simultaneously formed according to the principle that the location where the conductive lines 201, 202, ..., through 232 (narrow patterns) are formed is greatly influenced by the 3D etch effect due to the relatively narrow widths of the conductive lines 201, 202, ..., through 232 but the location where the contact pads 201C, 202C, ..., through 232C (wide patterns) are formed is insignificantly influenced by the 3D etch effect due to the relatively wide widths of the contact pads 201C, 202C, ..., through 232C. Accordingly, a plurality of conductive patterns having different widths may be simultaneously formed on the substrate 400 without having to perform an additional photolithography process, thereby simplifying the manufacturing process and reducing manufacturing costs.

In the method described with reference to FIGS. 4A through 15B, the conductive lines 201, 202, ..., through 232 and the contact pads 201C, 202C, ..., through 232C are simultaneously formed on the substrate 400. Therefore, it is possible to form fine pitch conductive patterns in the memory cell region 200A, wherein the pitch of the conductive patterns is about half the pitch that can be obtained according to a general photolithography process. In particular, if the conductive lines 201, 202, ..., through 232 are formed to have a width of 1 F (the minimum feature size of semiconductor device) and the distances between the conductive lines 201, 202, ..., through 232 are 1 F, then it is possible to obtain a sufficient alignment margin when the trimming process is performed to separate adjacent conductive lines in the connection region 200B, i.e., when the photolithography process is performed for forming the trimming mask pattern 470 as described above with reference to FIGS. 11A and 11B. Accordingly, it is possible to minimize the occurrence of problems caused by misalignment that is likely to occur when fine patterns are formed.

FIGS. 16A through 27B are plan and cross-sectional views illustrating a method of forming patterns of a semiconductor device, e.g., the semiconductor device 300 of FIG. 3, according to another embodiment of the inventive concept.

Figure 16A:
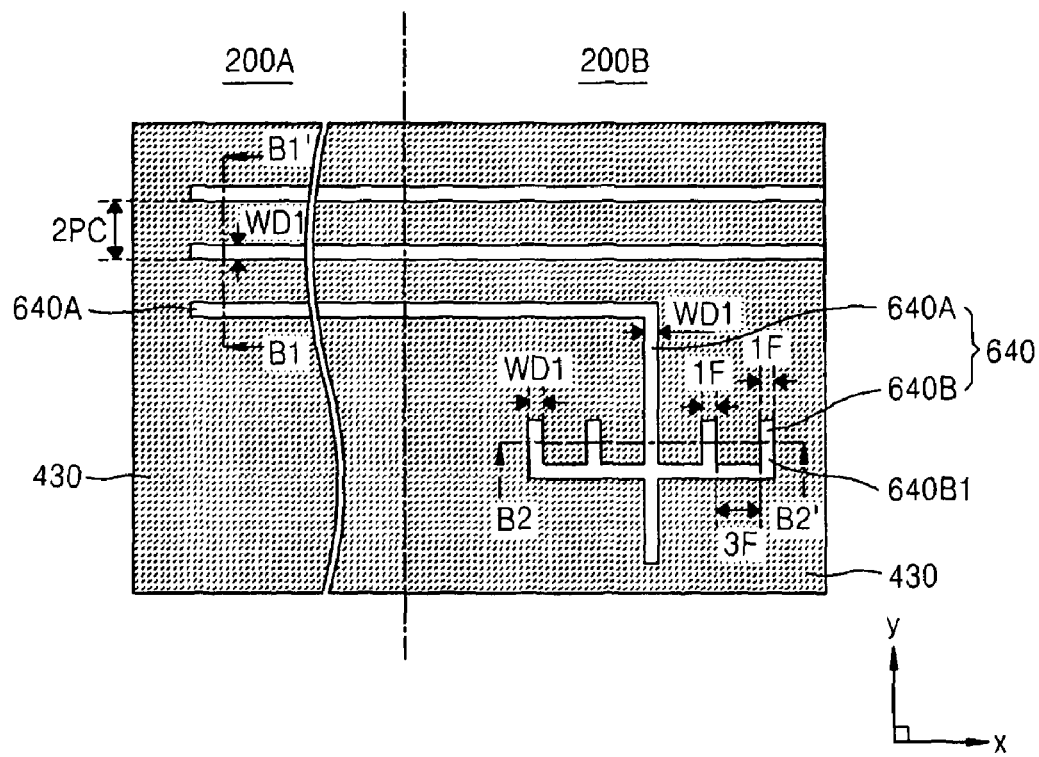
FIGS. 16A through 27B are plan views and cross-sectional views illustrating a method of forming patterns of a semiconductor device, according to another embodiment of the inventive concept.
Figure 16B:
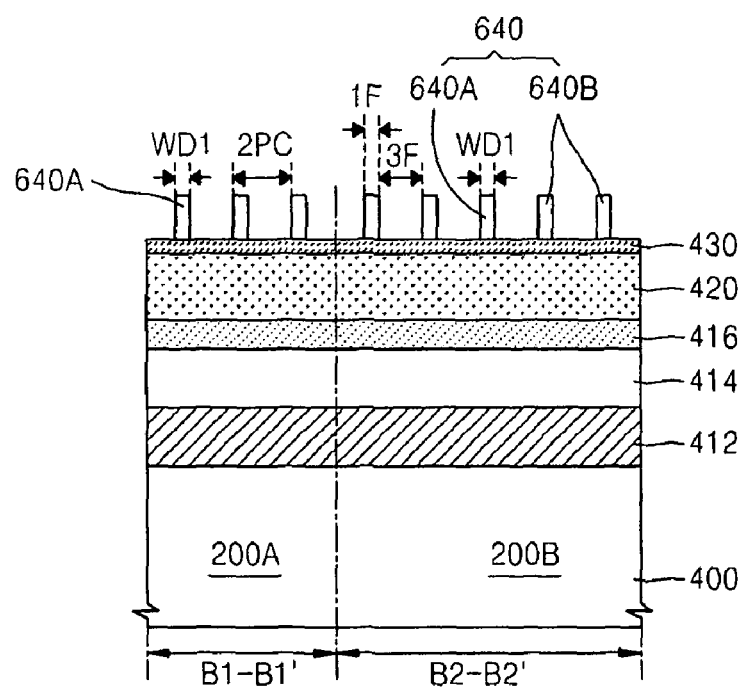
Figure 17A:
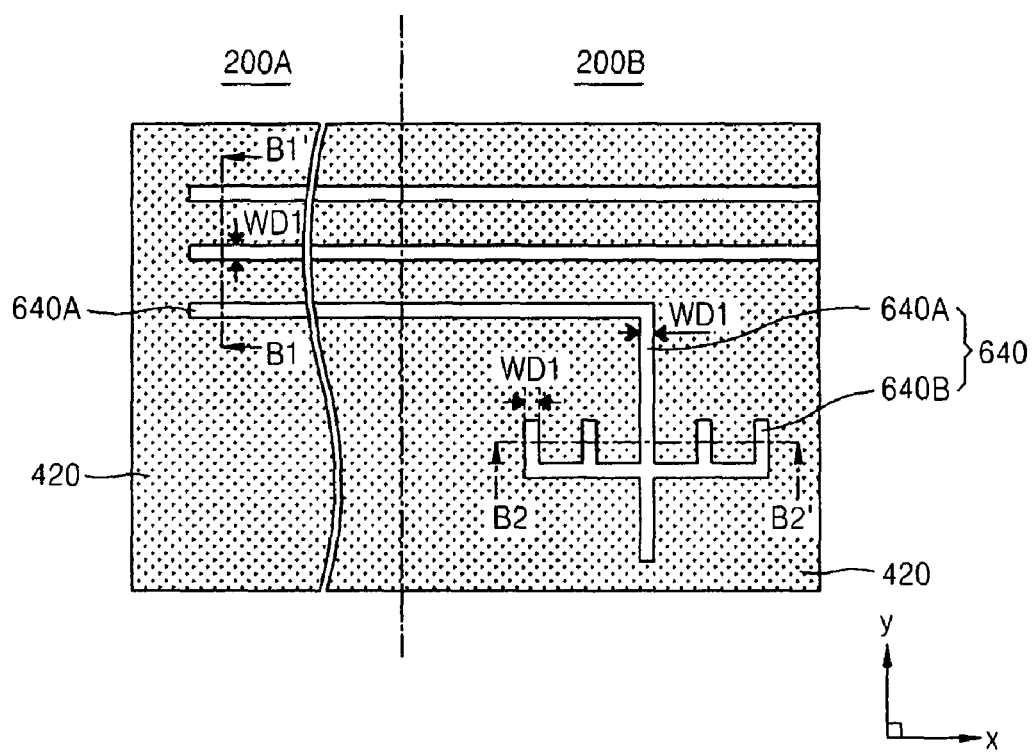
Figure 17B:
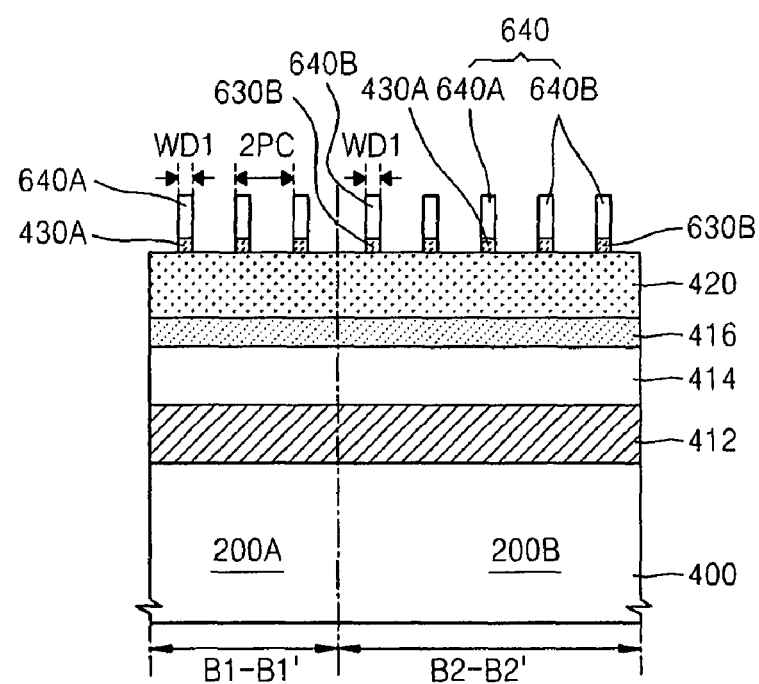

In particular, FIGS. 16A, 17A, ..., through 27A are plan views of a block indicated 16A in FIG. 3, and FIGS. 16B, 17B, ..., through 27B are cross-sectional views taken along a line B1-B1' and a line B2-B2' of FIGS. 16A, 17A, ..., through 27A.

The method illustrated in FIGS. 16A through 27B is similar to the method of FIGS. 4A through 15B except that a mask pattern 640 has a different construction than the mask pattern 440 described above with reference to FIG. 4A in order to form the plurality of contact pads 301C, 302C, ..., through 332C each including the concavo-convex line pattern 350 as illustrated in FIG. 3. In FIGS. 16A through 27B, reference numerals that are the same as those of FIGS. 4A through 15B denote the same elements, and thus, detailed descriptions thereof are not repeated here.

Referring to FIGS. 16A and 16B, as described above with reference to FIGS. 4A and 4B, a conductive layer 412, a hard mask layer 414, a buffer mask layer 416, a dual mask layer 420, and a variable mask layer 430 are sequentially formed on a substrate 400 in a memory cell region 200A and a connection region 200B. Then, a mask pattern 640 is formed on the variable mask layer 430.

The mask pattern 640 includes a first mask portion 640A and a second mask portion 640B. The first mask portion 640A has the same construction as the first mask portion 440A described above with reference to FIGS. 4A and 4B. Also, a plurality of the first mask portions 640A are formed to extend from the memory cell region 200A to the connection region 200B. However, the second mask portion 640B is a branch type pattern in which a plurality of branches 640B1 are each formed to have a width WD1 equal to the width WD1 of the first mask portion 640A, unlike the second mask portion 440B described above with reference to FIGS. 4A and 4B. The respective widths of the first and second mask portions 640A and 640B may be equal to a minimum size 1 F of a semiconductor device that is to be fabricated. The branches 640B1 of the second mask portion 640B may be apart from each other by a distance 3 F.

Referring to FIGS. 17A and 17B, a first variable mask pattern 430A and a second mask pattern 630B are formed in the memory cell region 200A and the connection region 200B by etching the variable mask layer 430 with the mask pattern 640 as an etch mask.

The first variable mask pattern 430A is disposed below the first mask portion 640A and the second mask pattern 630B is disposed below the second mask portion 640B.

The width of the mask pattern 640 is transcribed onto the variable mask layer 430, and thus, the first and second variable mask patterns 430A and 630B may each have a width equal to the respective width WD1 of the first and second mask portions 640A and 640B.

While the variable mask layer 430 is etched to form the first and second variable mask patterns 430A and 630B, the thickness of the mask pattern 640 may decrease.

Figure 18A:
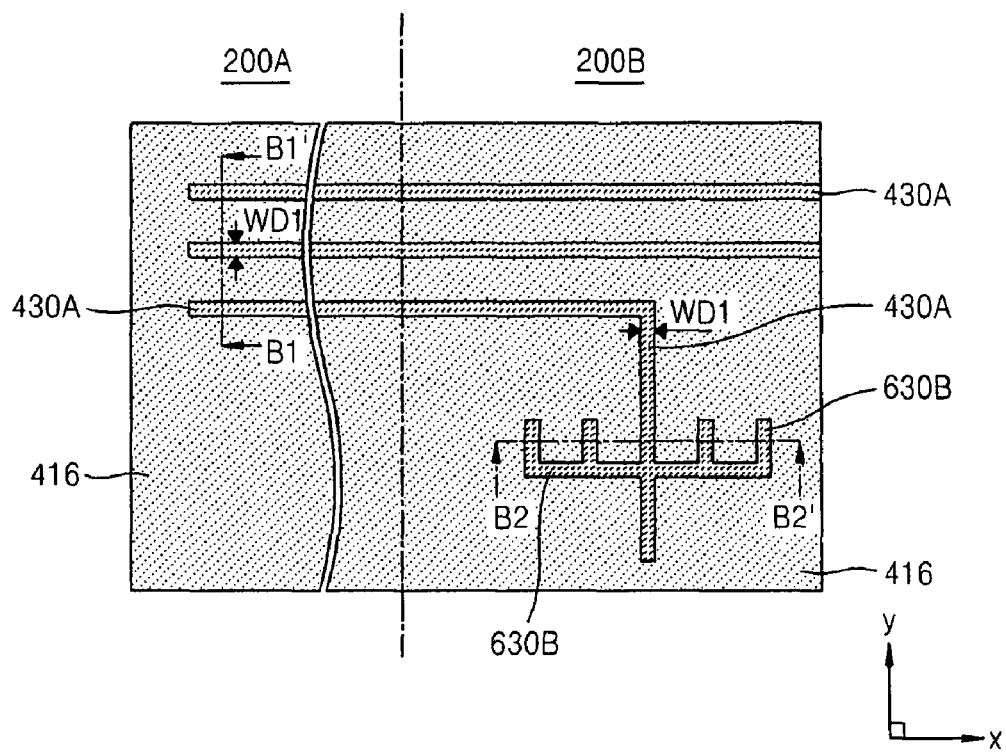
Figure 18B:
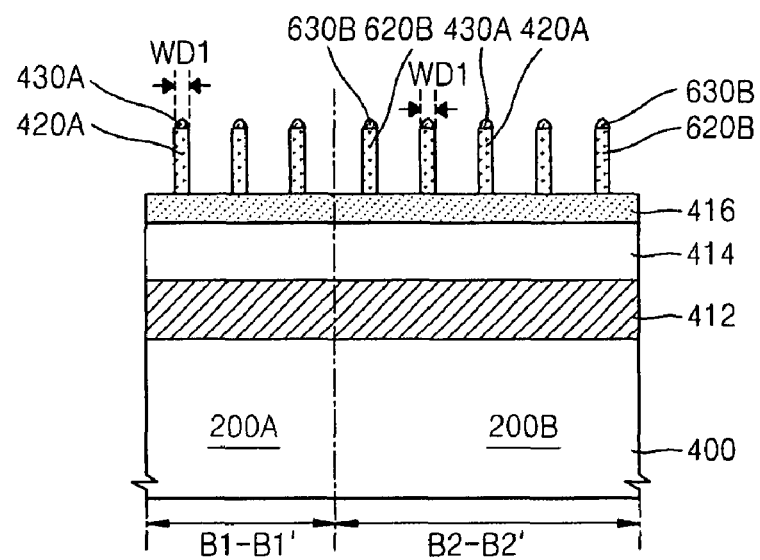

Referring to FIGS. 18A and 18B, as described above with reference to FIGS. 6A and 6B, the mask pattern 640 is removed and the dual mask layer 420 is etched using the first and second variable mask patterns 430A and 630B as etch masks until the buffer mask layer 416 is exposed, thereby forming a first mask pattern 420A below the first variable mask pattern 430A and a second mask pattern 620B below the second variable mask pattern 630B.

After the first and second mask patterns 420A and 620B are formed, the thickness of the first variable mask pattern 430A that remains on the first mask pattern 420A becomes approximately equal to that of the second variable mask pattern 630B that remains on the second mask pattern 620B, unlike as illustrated in FIGS. 6A and 6B.

Figure 19A:
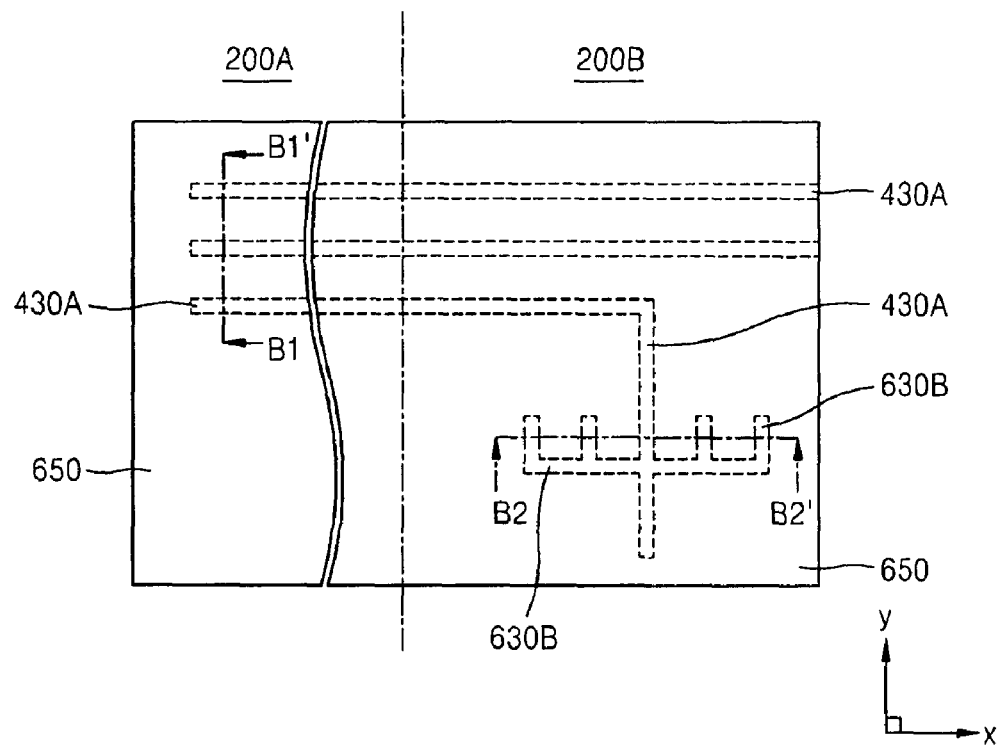
Figure 19B:
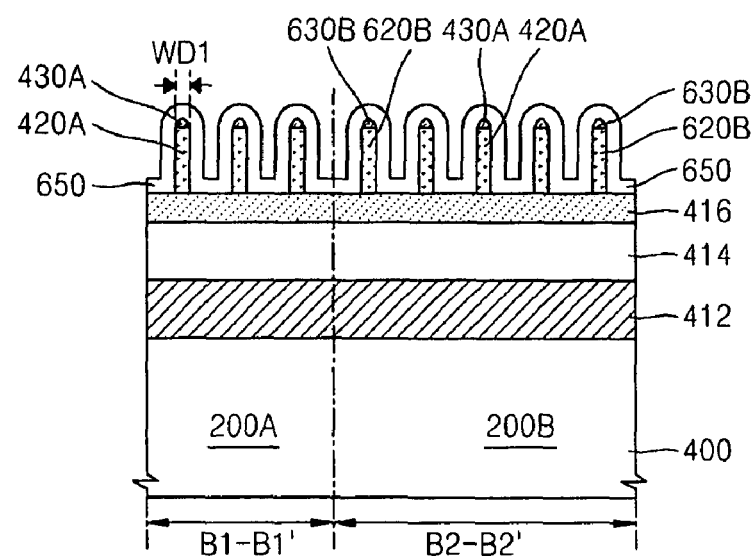

Referring to FIGS. 19A and 19B, as described above with reference to FIGS. 7A and 7B, a spacer mask layer 650 is formed to evenly cover the entire exposed surface of the resultant structure in which the first variable mask pattern 430A remains on the first mask pattern 420A and the second variable mask pattern 630B remains on the second mask pattern 620B. The spacer mask layer 650 may be formed of the same material as the spacer mask layer 450 described above with reference to FIGS. 7A and 7B. Also, the spacer mask layer 650 may be obtained according to the process used to form the spacer mask layer 450.

Figure 20A:
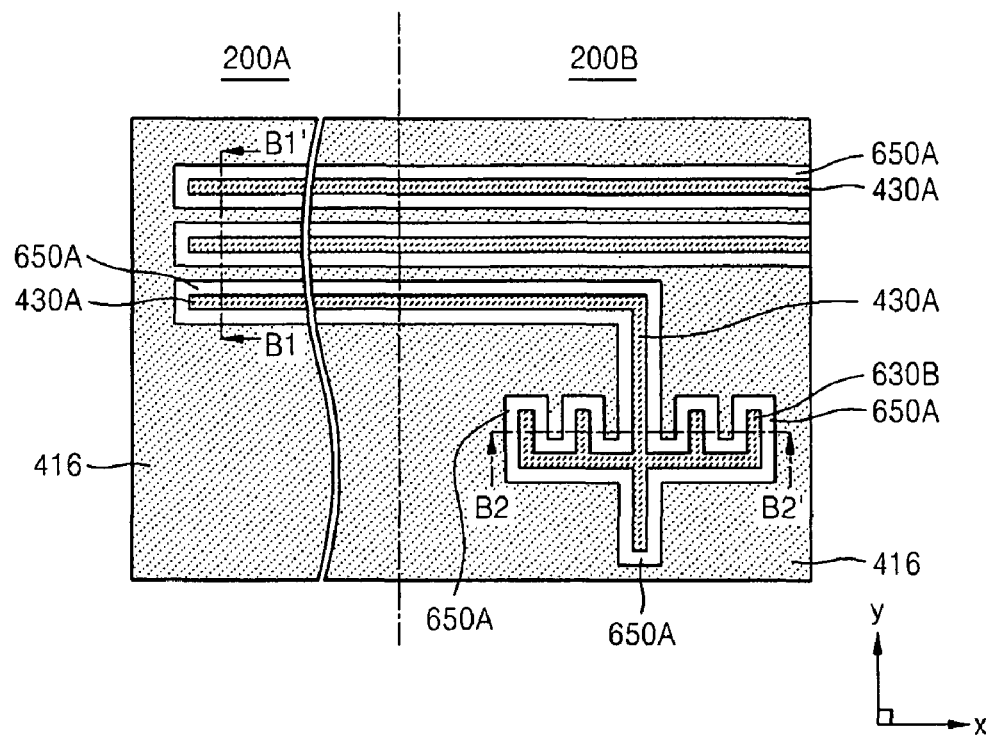
Figure 20B:
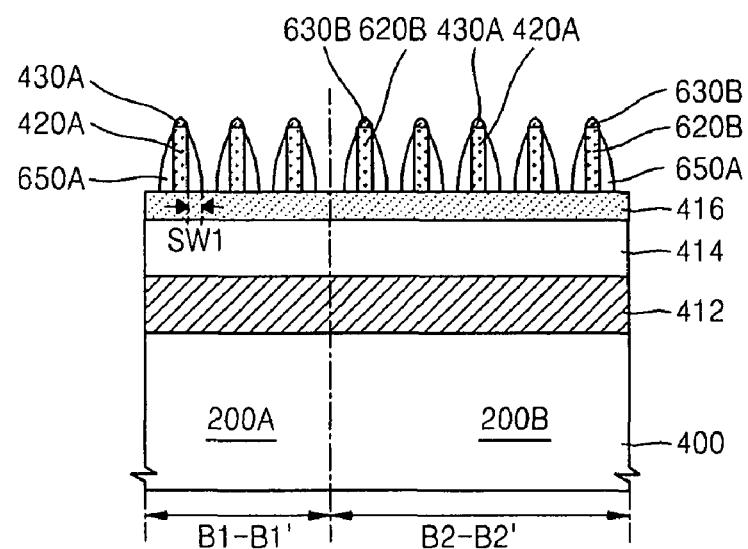

Referring to FIGS. 20A and 20B, as described above with reference to FIGS. 8A and 8B, a plurality of spacers 650A are obtained by etching the spacer mask layer 650 until an upper surface of the buffer mask layer 416 is exposed. The spacers 650A are formed on sidewalls of both the first mask pattern 420A and the second mask pattern 620B.

The spacers 650A are used as an etch mask for increasing the pattern densities of the memory cell region 200A and the connection region 200B.

In the memory cell region 200A and the connection region 200B, the spacers 650A may each have a width SW1 that is equal to the first width W1 of each of the conductive lines 201, 202, . . . , through 232 and the concavo-convex line pattern 350 of FIG. 3.

Figure 21A:
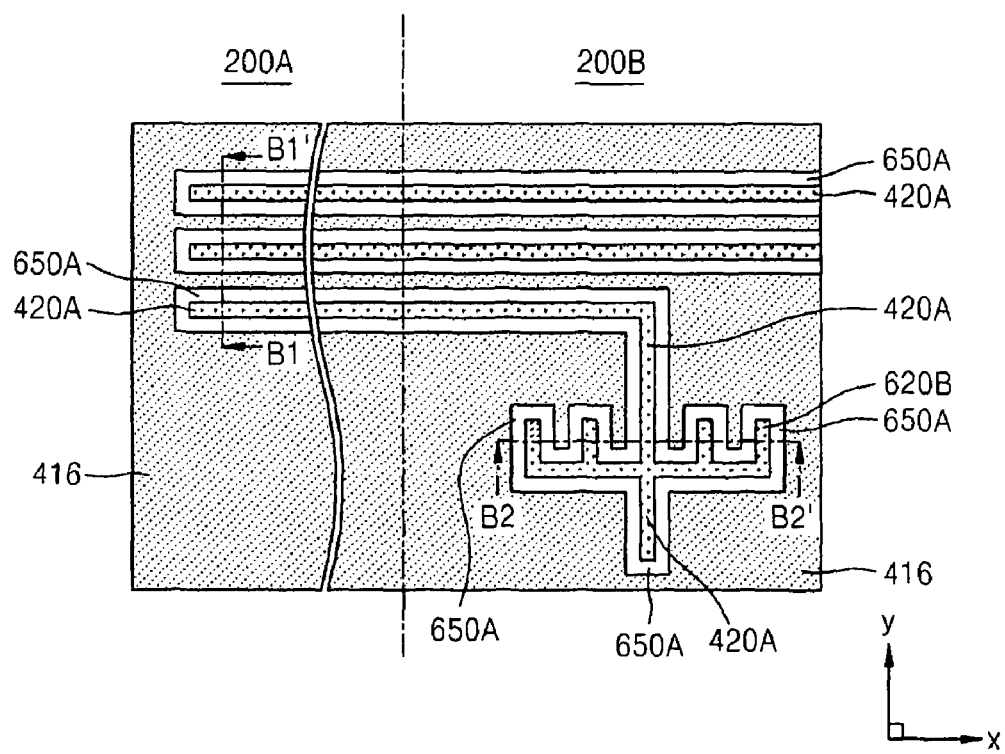
Figure 21B:
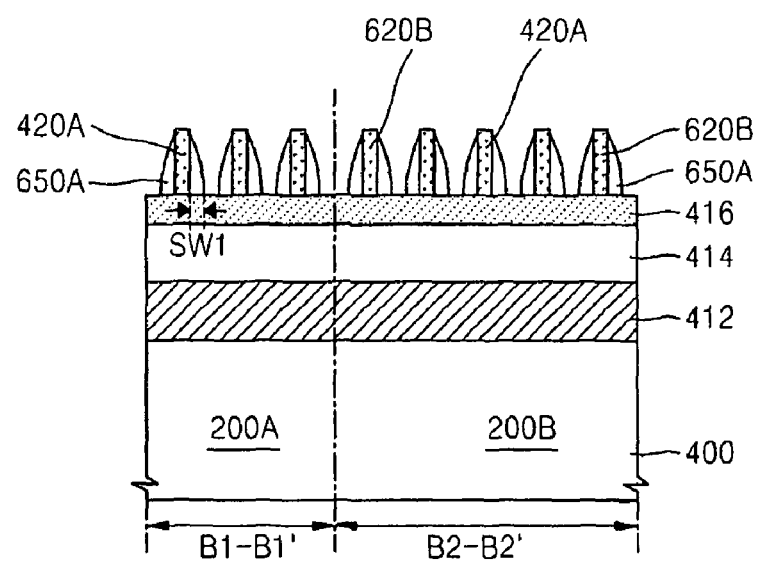

Referring to FIGS. 21A and 21B, upper surfaces of the first and second mask patterns 420A and 620B are exposed by removing the first and second variable mask patterns 430A and 630B as described above with reference to FIGS. 9A and 9B.

Figure 22A:
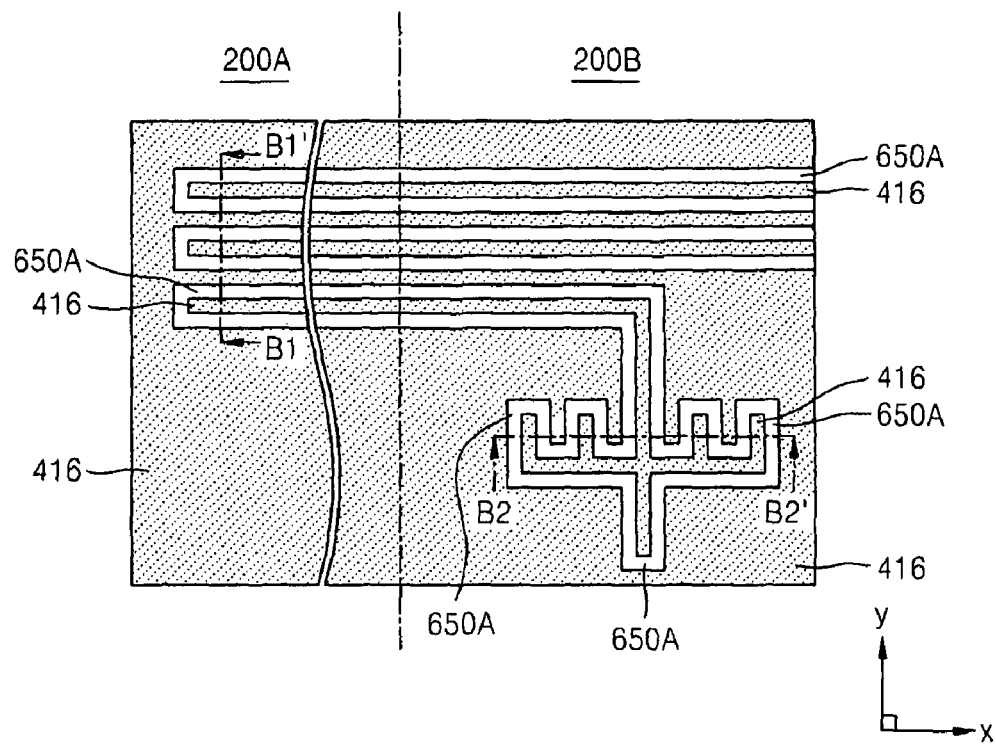
Figure 22B:
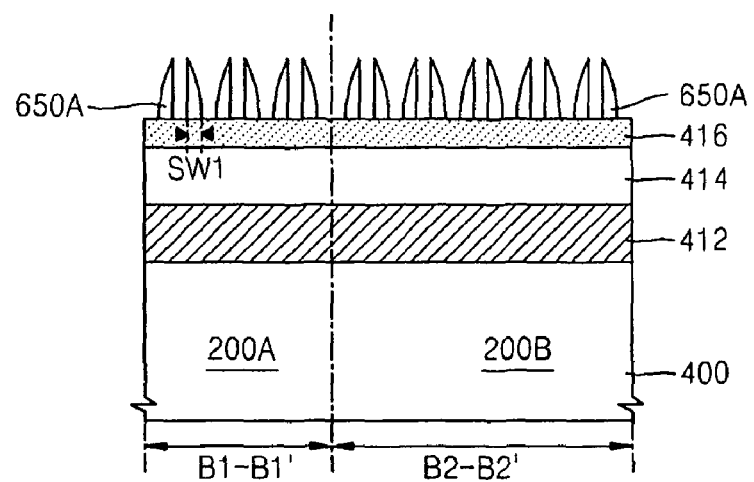

Referring to FIGS. 22A and 22B, the exposed first mask pattern 420A is removed from the memory cell region 200A and the connection region 200B as described above with reference to FIGS. 10A and 10B. However, in the current embodiment, not only the first mask pattern 420A but also the second mask pattern 620B are removed. Thus, the buffer mask layer 416 is exposed via a space between two adjacent spacers 650A of the spacers 650A.

Figure 23A:
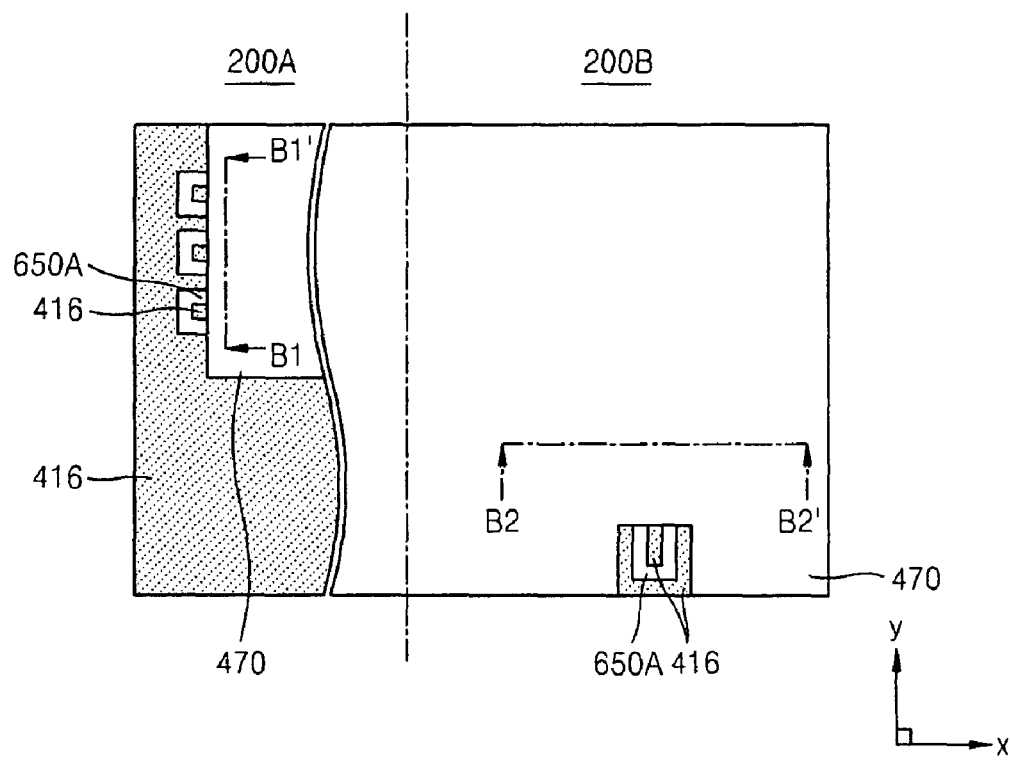
Figure 23B:
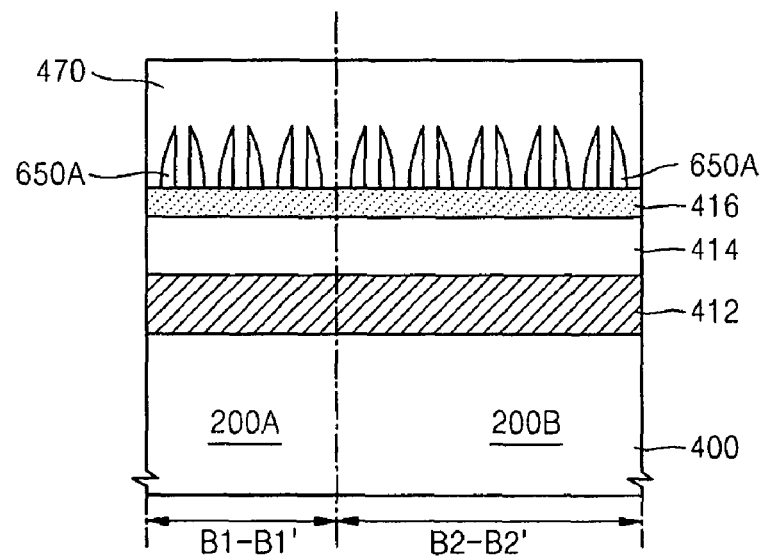

Referring to FIGS. 23A and 23B, a trimming mask pattern 470 is formed on the spacers 650A in the memory cell region 200A and the connection region 200B as described above with reference to FIGS. 11A and 11B, and partially exposes the spacers 650A in the memory cell region 200A and the connection region 200B.

Figure 24A:
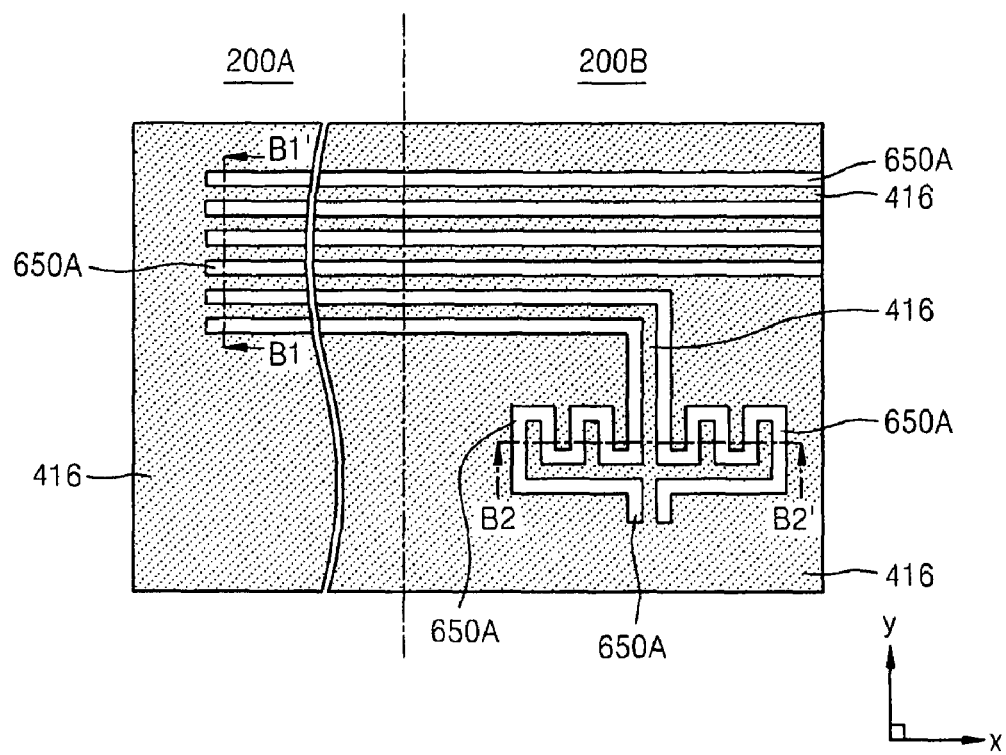
Figure 24B:
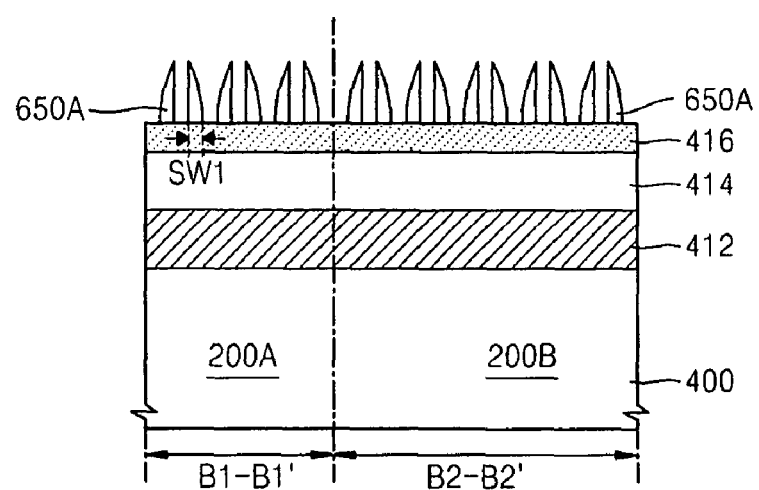

Referring to FIGS. 24A and 24B, a trimming process is performed to etch the exposed parts of the spacers 650A in the memory cell region 200A and the connection region 200B by using the trimming mask pattern 470 as an etch mask, as described above with reference to FIGS. 12A and 12B. As a result, each of the spacers 650A that were connected in a loop form in the memory cell region 200A and the connection region 200B of the substrate 400 is divided into two parts.

Thereafter, the trimming mask pattern 470 is removed.

Figure 25A:
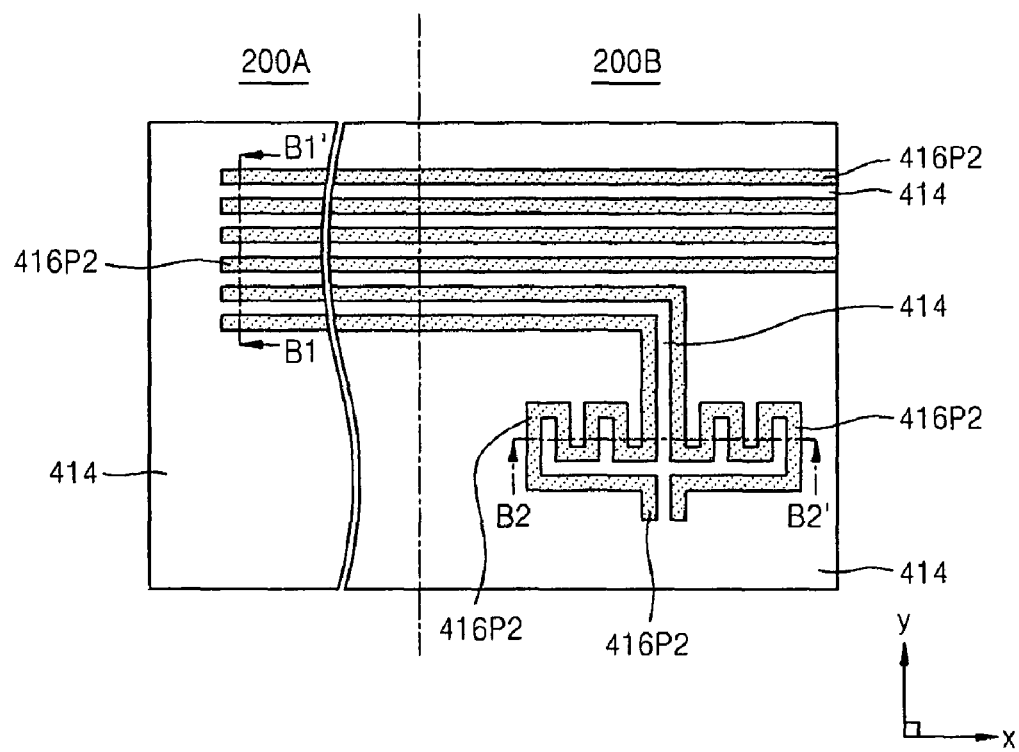
Figure 25B:
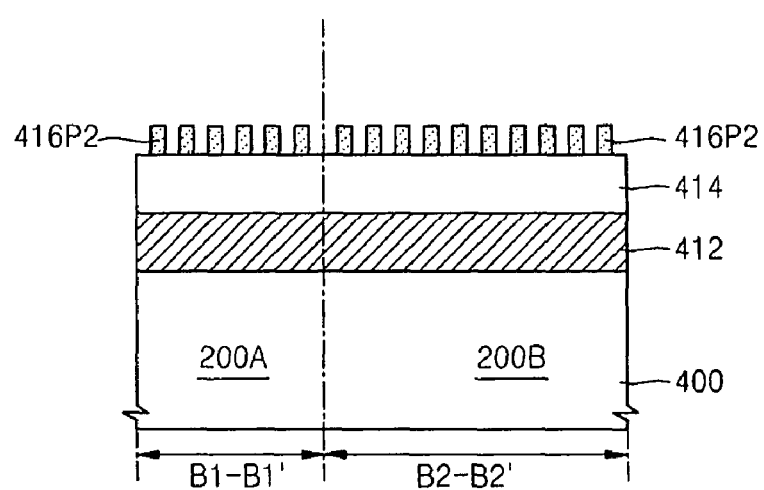

Referring to FIGS. 25A and 25B, a plurality of buffer mask patterns 416P2 are formed in the memory cell region 200A and the connection region 200B by etching the buffer mask layer 416 by using the spacers 650A as etch masks in the memory cell region 200A and the connection region 200B until the hard mask layer 414 is exposed, as described above with reference to FIGS. 13A and 13B. Thus, the hard mask layer 414 is exposed via the buffer mask patterns 416P2.

Although not shown, after the buffer mask patterns 416P2 are formed, portions of the spacers 650A may remain on the buffer mask patterns 416P2.

Figure 26A:
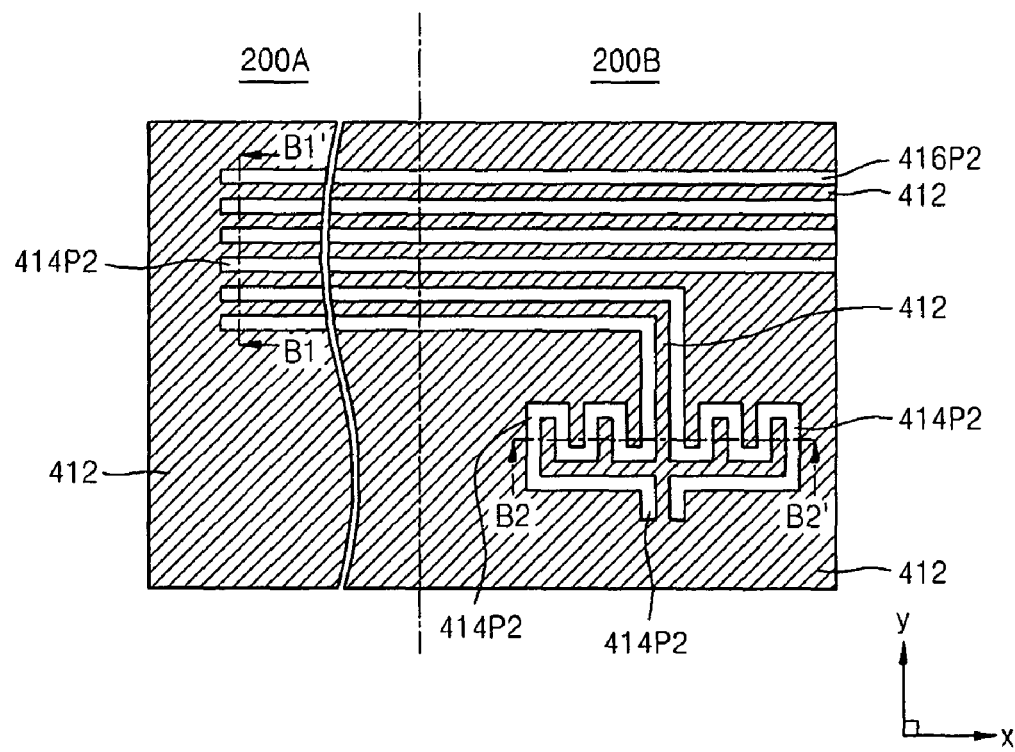
Figure 26B:
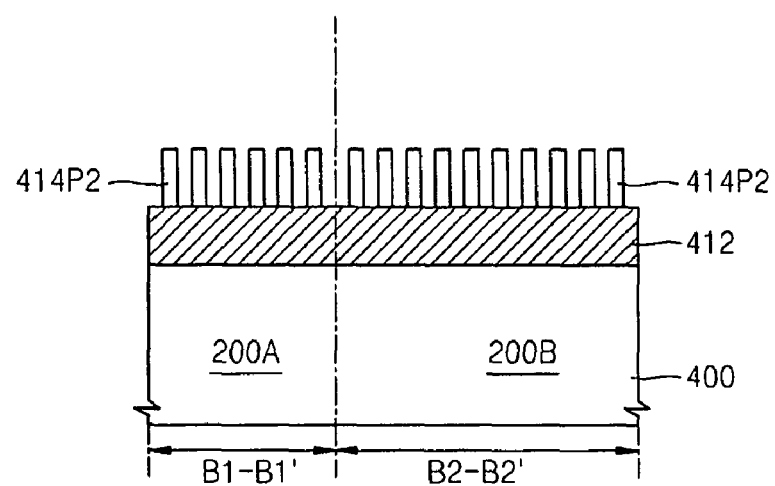

Referring to FIGS. 26A and 26B, a plurality of hard mask patterns 414P2 are formed in the memory cell region 200A and the connection region 200B by etching the hard mask layer 414 by using the buffer mask patterns 416P2 as etch masks in the memory cell region 200A and the connection region 200B until the conductive layer 412 is exposed, as described above with reference to FIGS. 14A and 14B. Thus, the conductive layer 412 is exposed via the hard mask patterns 414P2.

Although not shown, after the hard mask patterns 414P2 are formed, portions of the buffer mask patterns 416P2 may remain on the had mask patterns 414P2.

Figure 27A:
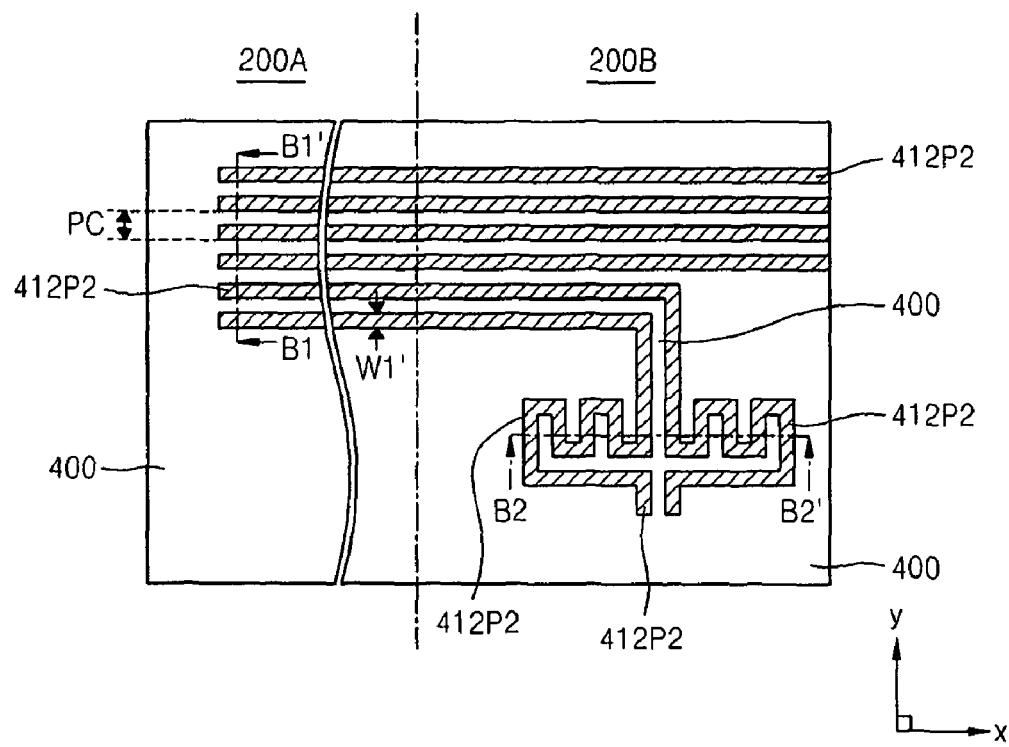
Figure 27B:
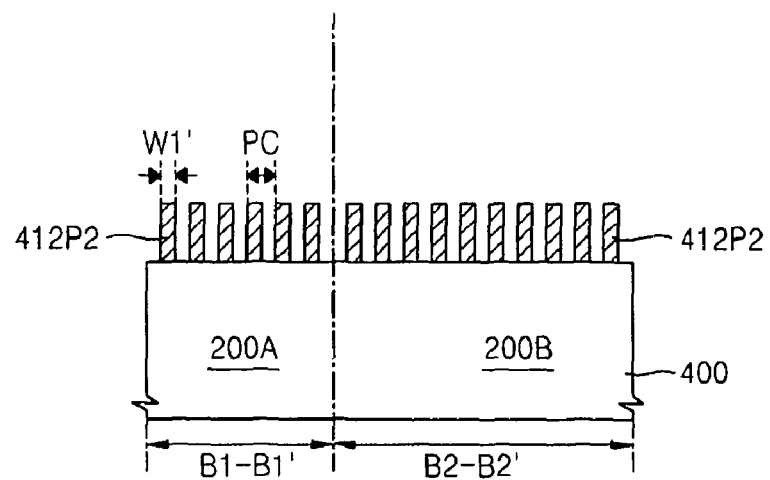

Referring to FIGS. 27A and 27B, a plurality of conductive patterns 412P2 are formed in the memory cell region 200A and the connection region 200B by etching the conductive layer 412 by using the hard mask patterns 414P2 as etch masks in the memory cell region 200A and the connection region 200B until the substrate 400 is exposed, as described above with reference to FIGS. 15A and 15B. Thus, the substrate 400 is exposed via the conductive patterns 412P2.

Although not shown, after the conductive patterns 412P2 are formed, portions of the hard mask patterns 414P2 may remain on the conductive patterns 412P2.

The conductive patterns 412P2 may constitute the conductive lines 201, 202, . . . , through 232, the contact pads 301C, 302C, . . . , through 332C, and the dummy conductive lines 201D, 202D, . . . , through 232D of the semiconductor device 300 illustrated in FIG. 3. In the memory cell region 202A, the conductive patterns 412P2 may each have a width W1' which is one quarter of the first pitch 2PC (see FIGS. 4A and 4B). The conductive patterns 412P2 may have a fine pitch PC which is half the first pitch 2PC.

In the method described with reference to FIGS. 16A through 27B, a double patterning process may be performed using the spacers 650A formed on the sidewalls of the first and second mask patterns 420A and 620B as etch masks in order to form the conductive lines 201, 202, . . . , through 232, the contact pads 301C, 302C, . . . , through 332C, and the dummy conductive lines 201D, 202D, . . . , through 232D illustrated in FIG. 3 that have fine widths and increased pattern density.

In the method described with reference to FIGS. 16A through 27B, the conductive lines 201, 202, . . . , through 232 and the contact pads 301C, 302C, . . . , through 332C are simultaneously formed on the substrate 400. Therefore, it is possible to form fine pitch conductive patterns in the memory cell region 200A and the connection region 200B, wherein the pitch of the conductive patterns is about half the pitch that can be obtained according to a general photolithography process. In particular, if the conductive lines 201, 202, . . . , through 232 are each formed to have a width of 1 F (the minimum feature size of semiconductor device) and the distances between the conductive lines 201, 202, . . . , through 232 are 1 F, then it is possible to obtain a sufficient alignment margin when the trimming process is performed to separate two adjacent conductive lines of the conductive lines in the connection region 200B, i.e., when the photolithography process is performed for forming the trimming mask pattern 470 as described above with reference to FIGS. 23A and 23B. Accordingly, it is possible to minimize the occurrence of problems caused by misalignment that is likely to occur when fine patterns are formed.

While the inventive concept has been particularly shown and described with reference to exemplary embodiments thereof, it will be understood that various changes in form and details may be made therein without departing from the spirit and scope of the following claims.

What is claimed is:

1. A semiconductor device comprising:

a plurality of conductive lines each comprising a first line portion extending on a substrate in a first direction and a second line portion extending from one end of the first line portion in a second direction different from the first direction;

a plurality of contact pads being respectively connected to the second line portions of the plurality of conductive lines; and a plurality of dummy conductive lines being respectively connected to the plurality of conductive lines via the plurality of contact pads, and extending from the plurality of contact pads to be opposite to the second line portions in parallel with the second line portions, wherein:

the plurality of conductive lines each comprise a first conductive line and a second conductive line which are adjacent to each other, the plurality of contact pads each comprise a first contact pad connected to the second line portion of the first conductive line and a second contact pad connected to the second line portion of the second conductive line, the first and second contact pads are symmetrical with each other about a line extending in the second direction, the first contact pad comprises a first concavo-convex line pattern extending from the second line portion of the first conductive line to the first dummy conductive line, the second contact pad comprises a second concavo-convex line pattern extending from the second line portion of the second conductive line to the second dummy conductive line, the first concavo-convex line pattern extends having the same width as the second line portion of the first conductive line in a direction of the length of the first concavo-convex line pattern, and the second concavo-convex line pattern extends having the same width as the second line portion of the second conductive line in a direction of the length of the second concavo-convex line pattern.

2. The semiconductor device of claim 1, wherein the space defined by the first and second concavo-convex line patterns is less than or equal to the distance between the first and second dummy conductive line patterns.

* * * * *